(12) United States Patent
Wang et al.

(10) Patent No.: US 10,002,977 B2
(45) Date of Patent: Jun. 19, 2018

(54) ELECTRO-CONDUCTIVE PASTE COMPRISING COARSE INORGANIC OXIDE PARTICLES IN THE PREPARATION OF ELECTRODES IN MWT SOLAR CELLS

(71) Applicant: Heraeus Deutschland GmbH & Co. KG, Hanau (DE)

(72) Inventors: Lei Wang, Conshohocken, PA (US); Crystal J. Han, Lafayette Hill, PA (US); Matthias Hörteis, Hanau (DE)

(73) Assignee: HERAEUS DEUTSCHLAND GMBH & CO. KG, Hanau (DE)

( * ) Notice: Subject to any disclaimer, the term of this patent is extended or adjusted under 35 U.S.C. 154(b) by 19 days.

(21) Appl. No.: 14/655,309

(22) PCT Filed: Dec. 23, 2013

(86) PCT No.: PCT/EP2013/003905
§ 371 (c)(1),
(2) Date: Jun. 24, 2015

(87) PCT Pub. No.: WO2014/101999
PCT Pub. Date: Jul. 3, 2014

(65) Prior Publication Data
US 2015/0340517 A1    Nov. 26, 2015

Related U.S. Application Data

(60) Provisional application No. 61/746,966, filed on Dec. 28, 2012.

(30) Foreign Application Priority Data

Dec. 28, 2012    (EP) .................................... 12008655

(51) Int. Cl.
*H01B 1/22*         (2006.01)
*H01L 31/0224*   (2006.01)
(Continued)

(52) U.S. Cl.
CPC .......... *H01L 31/02245* (2013.01); *C03C 8/16* (2013.01); *C03C 8/18* (2013.01);
(Continued)

(58) Field of Classification Search
CPC .... C03C 8/16; C03C 8/18; H01B 1/22; H01L 31/022425; H01L 31/02245;
(Continued)

(56) References Cited

U.S. PATENT DOCUMENTS 3,450,545 A    6/1969    Ballard et al.
4,098,949 A    7/1978    Kosiorek
(Continued)

FOREIGN PATENT DOCUMENTS

CN    1590333 A       3/2005
EP    0518004 A2    12/1992
(Continued)

OTHER PUBLICATIONS

International Search Report issued in PCT/EP2013/003905 dated Mar. 4, 2014.

*Primary Examiner* — Mark Kopec
*Assistant Examiner* — Jaison P Thomas
(74) *Attorney, Agent, or Firm* — Blank Rome LLP

(57) ABSTRACT

The invention relates to an electro-conductive paste comprising coarse $SiO_2$ particles in the preparation of electrodes in solar cells, particularly in the preparation of electrodes in MWT solar cells, particularly in the preparation of the metal wrap through, or plug, electrode in such solar cells. In particular, the invention relates to a solar cell precursor, a process for preparing a solar cells, a solar cell and a module comprising solar cells.

The invention relates to a solar cell precursor at least comprising as precursor parts:
  i) a wafer (101) with at least one hole (315) with a Si surface (113);
(Continued)

ii) an electro-conductive paste (105) at least comprising as paste constituents:
  a) metallic particles;
  b) an inorganic reaction system;
  c) an organic vehicle; and
  d) inorganic oxide particles having no glass transition temperature below about 750° C. or a glass transition temperature which is at least about 50° C. higher than the glass transition temperature of the inorganic reaction system; and
  e) an additive;
comprised by the hole.

67 Claims, 8 Drawing Sheets

(51) Int. Cl.
  *H01L 31/042* (2014.01)
  *H01L 31/028* (2006.01)
  *H01L 31/18* (2006.01)
  *C03C 8/18* (2006.01)
  *H01L 31/068* (2012.01)
  *C03C 8/16* (2006.01)

(52) U.S. Cl.
  CPC .............. *H01B 1/22* (2013.01); *H01L 31/028* (2013.01); *H01L 31/042* (2013.01); *H01L 31/068* (2013.01); *H01L 31/1804* (2013.01); *Y02E 10/547* (2013.01)

(58) Field of Classification Search
  CPC ........... H01L 31/022458; H01L 31/068; H01L 31/028; H01L 31/042; H01L 31/1804; Y02E 10/547
  See application file for complete search history.

(56) References Cited

U.S. PATENT DOCUMENTS

| | | |
|---|---|---|
| 4,598,167 A | 7/1986 | Ushifusa et al. |
| 2001/0015603 A1 | 8/2001 | Miki et al. |
| 2009/0101210 A1* | 4/2009 | Carroll ............... H01B 1/16 |
| | | 136/261 |
| 2011/0139238 A1* | 6/2011 | Hang ................ C03C 8/02 |
| | | 136/256 |
| 2011/0192456 A1 | 8/2011 | Hang et al. |
| 2012/0067415 A1 | 3/2012 | Tachizono et al. |
| 2012/0174974 A1 | 7/2012 | Khadilkar et al. |

FOREIGN PATENT DOCUMENTS

| | | | |
|---|---|---|---|
| EP | 1058492 A2 | 12/2000 | |
| JP | H0316445 A | 1/1991 | |
| JP | 2006-313744 | * 11/2006 | ............... H01B 1/22 |
| JP | 2011171271 A | 9/2011 | |
| WO | WO-2010040016 A2 | 4/2010 | |
| WO | WO-2011090212 A1 | 7/2011 | |
| WO | WO-2011090213 A1 | 7/2011 | |
| WO | WO-2012141187 A1 | 10/2012 | |

* cited by examiner

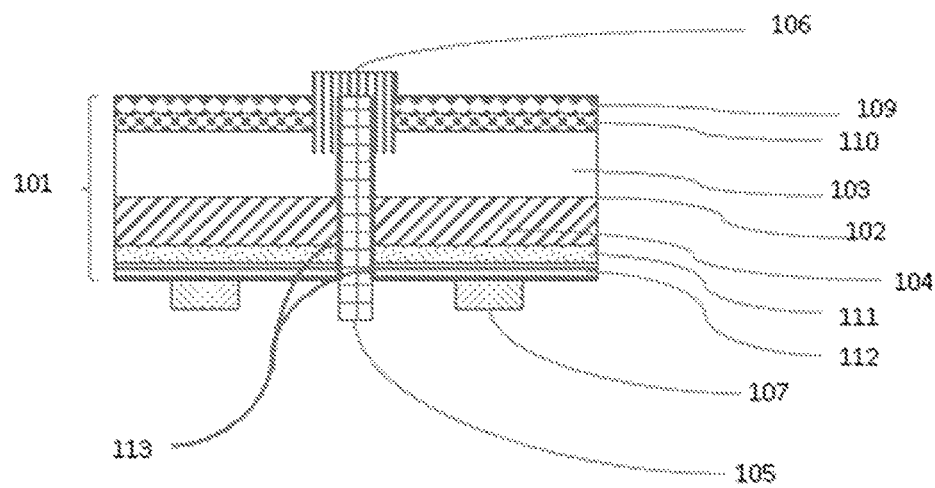
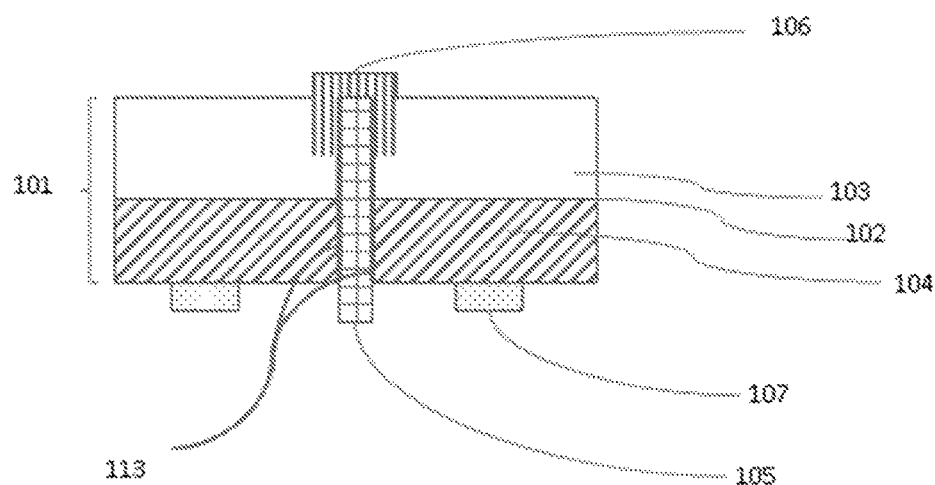

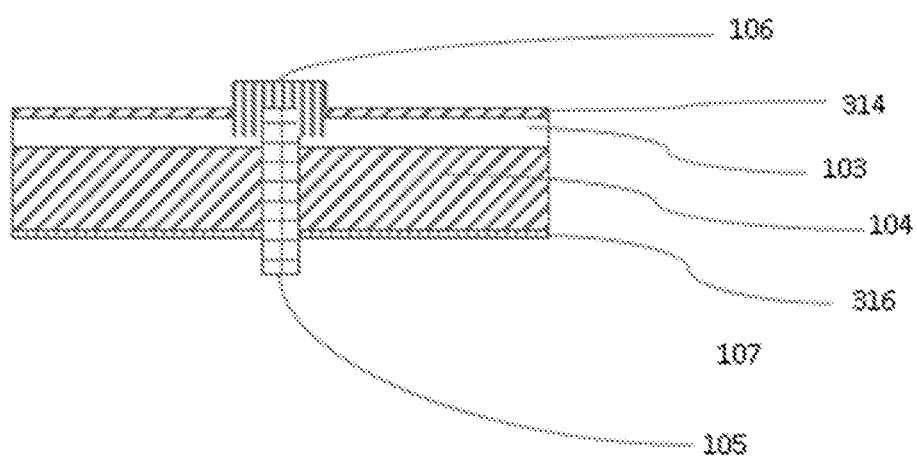

400b  Figure 4b
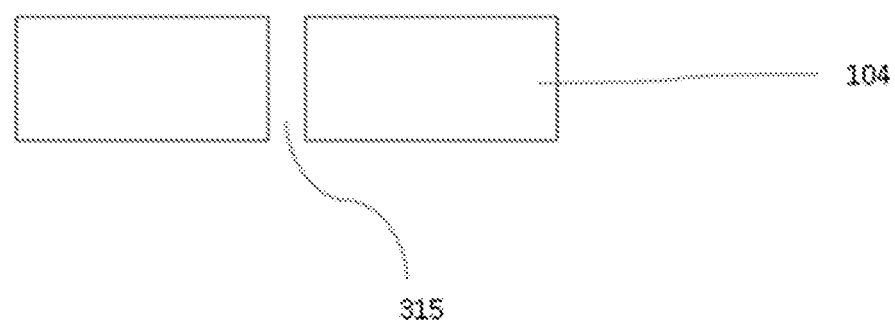
400c  Figure 4c
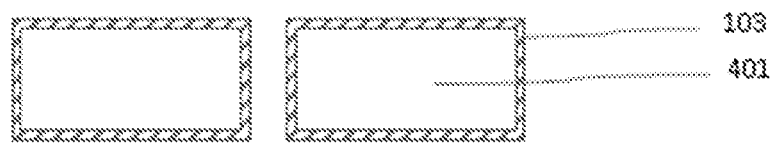

400d  Figure 4d
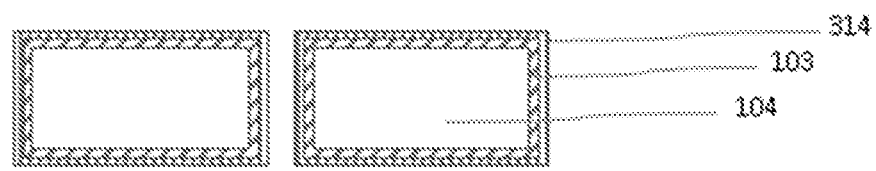
400e  Figure 4e
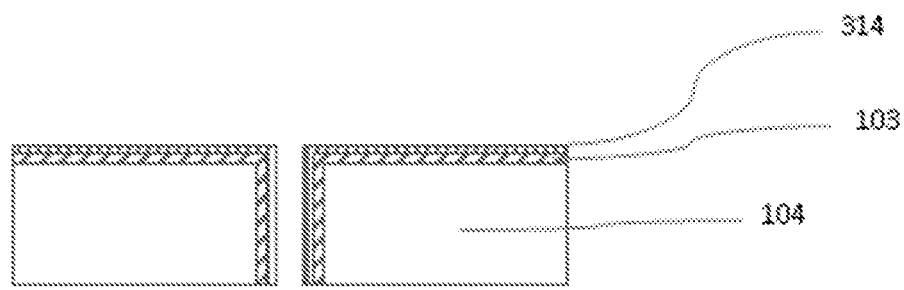

500a    Figure 5a
500b    Figure 5b
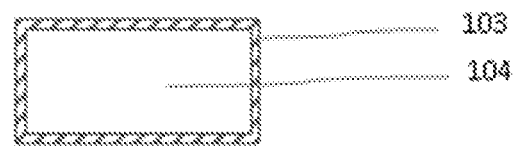

500c  Figure 5c
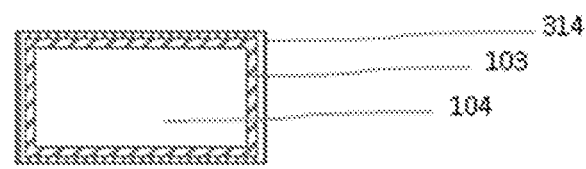
500d  Figure 5d
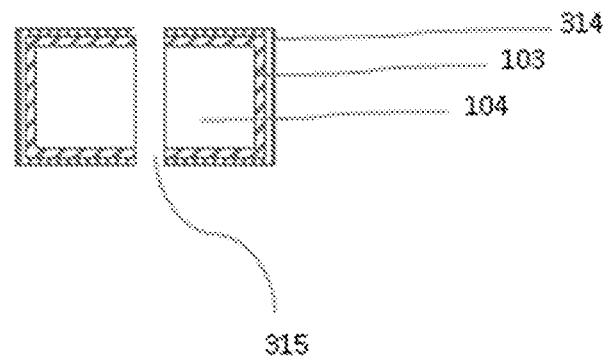

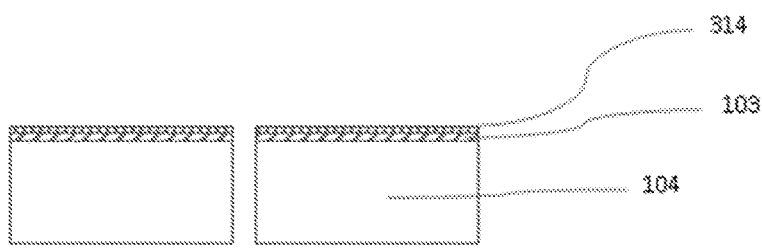
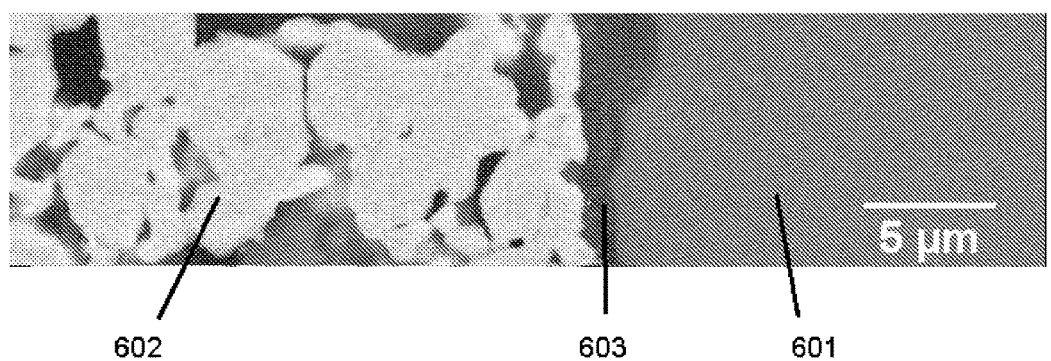

ELECTRO-CONDUCTIVE PASTE COMPRISING COARSE INORGANIC OXIDE PARTICLES IN THE PREPARATION OF ELECTRODES IN MWT SOLAR CELLS

This application is a national stage of International Patent Application No. PCT/EP2013/003905, filed Dec. 23, 2013, which claims the benefit of European Patent Application 12008655.8, filed Dec. 28, 2012, and U.S. Provisional Patent Application No. 61/746,966, filed Dec. 28, 2012, which are hereby incorporated by reference

FIELD OF THE INVENTION

The invention relates to an electro-conductive paste comprising coarse inorganic oxide particles in the preparation of electrodes in solar cells, particularly in the preparation of electrodes in MWT solar cells, particularly in the preparation of the metal wrap through, or plug, electrode in such solar cells. In particular, the invention relates to a solar cell precursor, a process for preparing a solar cell, a solar cell and a module comprising solar cells.

BACKGROUND OF THE INVENTION

Solar cells are devices that convert the energy of light into electricity using the photovoltaic effect. Solar power is an attractive green energy source because it is sustainable and produces only non-polluting by-products. Accordingly, a great deal of research is currently being devoted to developing solar cells with enhanced efficiency while continuously lowering material and manufacturing costs. When light hits a solar cell, a fraction of the incident light is reflected by the surface and the remainder transmitted into the solar cell. The transmitted photons are absorbed by the solar cell, which is usually made of a semiconducting material, such as silicon which is often doped appropriately. The absorbed photon energy excites electrons of the semiconducting material, generating electron-hole pairs. These electron-hole pairs are then separated by p-n junctions and collected by conductive electrodes on the solar cell surfaces. FIG. 2 shows a minimal construction for a simple solar cell.

Solar cells are very commonly based on silicon, often in the form of a Si wafer. Here, a p-n junction is commonly prepared either by providing an n-type doped Si substrate and applying a p-type doped layer to one face or by providing a p-type doped Si substrate and applying an n-type doped layer to one face to give in both cases a so called p-n junction. The face with the applied layer of dopant generally acts as the front face of the cell, the opposite side of the Si with the original dopant acting as the back face. Both n-type and p-type solar cells are possible and have been exploited industrially. Cells designed to harness light incident on both faces are also possible, but their use has been less extensively harnessed.

In order to allow incident light on the front face of the solar cell to enter and be absorbed, the front electrode is commonly arranged in two sets of perpendicular lines known as "fingers" and "bus bars" respectively. The fingers form an electrical contact with the front face and bus bars link these fingers to allow charge to be drawn off effectively to the external circuit. It is common for this arrangement of fingers and bus bars to be applied in the form of an electroconductive paste which is fired to give solid electrode bodies. A back electrode is also often applied in the form of an electro-conductive paste which is then fired to give a solid electrode body.

Another approach to solar cell preparation seeks to increase the proportion of incident light which is absorbed by the front face by means of back contacting of the front electrode. In so called MWT ("Metal Wrap Through") solar cells, electrodes on the front face of the solar cell are contacted with the back face by means of channels joining the front and back face which contain electrode material, often known as a metal wrap through electrode or a plug electrode.

A typical electro-conductive paste contains metallic particles, inorganic reaction system, and an organic vehicle.

There is a need in the state of the art for solar cells with improved properties, in particular for MWT solar cells with improved properties.

SUMMARY OF THE INVENTION

The invention is generally based on the object of overcoming at least one of the problems encountered in the state of the art in relation to solar cells, in particular in relation to metal wrap through solar cells, and in particular in relation to the mechanical and electrical properties of the metal wrap through electrode.

More specifically, the invention is further based on the object of providing a metal wrap through electrode which exhibits low electrical contact, and preferably also high physical adhesion, with the Si surface of the channel in an MWT solar cell, preferably whilst simultaneously exhibiting other favourable electrical and physical properties of the solar cell.

A contribution to achieving at least one of the above described objects is made by the subject matter of the category forming claims of the invention. A further contribution is made by the subject matter of the dependent claims of the invention which represent specific embodiments of the invention.

DETAILED DESCRIPTION

A contribution to achieving at least one of the above described objects is made by a solar cell precursor at least comprising as precursor parts:
 i) a wafer with at least one hole with a Si surface;
 ii) an electro-conductive paste at least comprising as paste constituents:
  a) metallic particles;
  b) an inorganic reaction system;
  c) an organic vehicle; and
  d) inorganic oxide particles having no glass transition temperature below about 750° C., preferably below about 900° C. and more preferably below about 1100° C.,
  or
   a glass transition temperature which is at least about 50 K higher, preferably at least about 100 K higher, more preferably at least about 200 K higher, than the glass transition temperature of the inorganic reaction system; and
  e) an additive;
  comprised by the hole.

In one embodiment of the solar cell precursor according to the invention, the inorganic oxide particles are present in a range from about 0.1 to about 22 wt. %, preferably in a range from about 1 to about 15 wt. %, more preferably in a range from about 3 to about 10 wt. %, based on the total weight of the paste.

In one embodiment of the solar cell precursor according to the invention, the paste further comprises a vanadium containing compound. In one aspect of this embodiment, the vanadium content of the vanadium containing compound is in a range from about 0.05 to about 12 wt. %, preferably in a range from about 0.05 to about 8 wt. %, more preferably in a range from about 1 to about 5 wt. %, based on the total weight of the paste. In another aspect of this embodiment, the vanadium content of the vanadium containing compound and the content of elements other than oxygen in the inorganic oxide particles are in a weight ratio in a range from about 7:1 to about 2:1, preferably in a range from about 6:1 to about 3:1, more preferably in a range from about 5:1 to about 7:2. In another aspect of this embodiment, the vanadium containing compound is $V_2O_5$.

In one embodiment of the solar cell precursor according to the invention, the paste further contains a phosphorus containing material selected from the group consisting of elemental phosphorus, a phosphorus containing compound, or both. In one aspect of this embodiment, the phosphorus content of the phosphorus containing material, is present in the paste in a range from about 0.1 to about 22 wt. %, preferably in a range from about 0.1 to about 15 wt. %, more preferably in a range from about 0.2 to about 5 wt. %, based on the total weight of the paste. In another aspect of this embodiment, the phosphorus content of the phosphorus containing material and the content of elements other than oxygen in the inorganic oxide particles are in a weight ratio in a range from about 1:9 to about 2:1, more preferably in a range from about 1:7 to about 1:1, most preferably in a range from about 1:5 to about 1:2. In another aspect of this embodiment, the phosphorus containing material is red phosphorus or phosphorus oxide.

In one embodiment of the solar cell precursor according to the invention, the inorganic reaction system is present in the paste in a range from about 0.1 to about 5 wt. %, preferably in a range from 0.3 to 3 wt. %, more preferably in a range from 0.5 to 2

In one embodiment of the solar cell precursor according to the invention, the inorganic oxide particles are $SiO_2$ particles.

In one embodiment of the solar cell precursor according to the invention, the inorganic oxide particles have a value of $d_{50}$ greater than about 8 preferably greater than about 10 µm, more preferably greater than about 12 µm. In some cases the value of $d_{50}$ for the inorganic oxide is as great as 20 mm or less.

In one embodiment of the solar cell precursor according to the invention, the inorganic reaction system is glass frit.

In one embodiment of the solar cell precursor according to the invention, at least one hole is a channel joining the front face and the back face of the wafer.

In one embodiment of the solar cell precursor according to the invention, the Si surface in at least one hole comprises at least a p-type doped section and an n-type doped section.

In one embodiment of the solar cell precursor according to the invention, the metallic particles are Ag particles.

In one embodiment of the solar cell precursor according to the invention, the paste is in direct contact with the Si surface of the hole.

In one embodiment of the solar cell precursor according to the invention, a further electroconductive paste is present on the front face of the wafer. In another embodiment, at least one further electro-conductive paste is present on the back face of the wafer. In a further embodiment, further pastes are present on both the back and the front faces of the wafer.

In one embodiment of the solar cell precursor, at least 50% by weight, preferably at least 70% by weight, more preferably at least 90% by weight, of the inorganic oxide particles reside on a 230 mesh sieve.

A contribution to achieving at least one of the above described objects is made by a process for the preparation of a solar cell at least comprising the steps:
 i) provision of a solar cell precursor according to the invention;
 ii) firing of the solar cell precursor to obtain a solar cell.
 In one aspect of this embodiment, the provision according to step i) at least comprises the steps:
  a) provision of a Si wafer with a back doped layer and a front doped layer of opposite doping types;
  b) making of at least one hole in the wafer;
  c) introduction of an electro-conductive paste into at least one hole to give a solar cell precursor according to the invention;

A contribution to achieving at least one of the above described objects is made by a solar cell obtainable by the process according to the invention.

In one embodiment of the solar cell according to the invention, the solar cell at least comprises as solar cell parts:
 i) a wafer with at least one hole with a Si surface;
 ii) an electrode comprised by a hole,
wherein the concentration of glass in the electrode is higher at the surface at which the electrode contacts the Si surface than in the main body of the electrode.

A contribution to achieving at least one of the above described objects is made by a module comprising at least one solar cell according to the invention and at least a further solar cell.

Wafer

Preferred wafers according to the invention are regions, among other regions of the solar cell, capable of absorbing light with high efficiency to yield electron-hole pairs and separating holes and electrons across a boundary with high efficiency, preferably across a so called p-n junction boundary. Preferred wafers according to the invention are those comprising a single body made up of a front doped layer and a back doped layer.

It is preferred for that wafer to consist of appropriately doped tetravalent elements, binary compounds, tertiary compounds or alloys. Preferred tetravalent elements in this context are Si, Ge or Sn, preferably Si. Preferred binary compounds are combinations of two or more tetravalent elements, binary compounds of a group III element with a group V element, binary compounds of a group II element with a group VI element or binary compounds of a group IV element with a group VI element. Preferred combinations of tetravalent elements are combinations of two or more elements selected from Si, Ge, Sn or C, preferably SiC. The preferred binary compounds of a group III element with a group V element is GaAs. It is most preferred according to the invention for the wafer to be based on Si. Si, as the most preferred material for the wafer, is referred to explicitly throughout the rest of this application. Sections of the following text in which Si is explicitly mentioned also apply for the other wafer compositions described above.

Where the front doped layer and back doped layer of the wafer meet is the p-n junction boundary. In an n-type solar cell, the back doped layer is doped with electron donating n-type dopant and the front doped layer is doped with electron accepting or hole donating p-type dopant. In a p-type solar cell, the back doped layer is doped with p-type dopant and the front doped layer is doped with n-type dopant. It is preferred according to the invention to prepare a wafer with a p-n junction boundary by first providing a doped Si substrate and then applying a doped layer of the opposite type to one face of that substrate.

Doped Si substrates are well known to the person skilled in the art. The doped Si substrate can be prepared in any way known to the person skilled in the art and which he considers to be suitable in the context of the invention. Preferred sources of Si substrates according to the invention are mono-crystalline Si, multi-crystalline Si, amorphous Si and upgraded metallurgical Si, mono-crystalline Si or multi-crystalline Si being most preferred. Doping to form the doped Si substrate can be carried out simultaneously by adding dopant during the preparation of the Si substrate or can be carried out in a subsequent step. Doping subsequent to the preparation of the Si substrate can be carried out for example by gas diffusion epitaxy. Doped Si substrates are also readily commercially available. According to the invention it is one option for the initial doping of the Si substrate to be carried out simultaneously to its formation by adding dopant to the Si mix. According to the invention it is one option for the application of the front doped layer and the highly doped back layer, if present, to be carried out by gas-phase epitaxy. This gas phase epitaxy is preferably carried out at a temperature in a range from about 500° C. to about 900° C., more preferably in a range from about 600° C. to about 800° C. and most preferably in a range from about 650° C. to about 750° C. at a pressure in a range from about 2 kPa to about 100 kPa, preferably in a range from about 10 to about 80 kPa, most preferably in a range from about 30 to about 70 kPa.

It is known to the person skilled in the art that Si substrates can exhibit a number of shapes, surface textures and sizes. The shape can be one of a number of different shapes including cuboid, disc, wafer and irregular polyhedron amongst others. The preferred shape according to the invention is wafer shaped where that wafer is a cuboid with two dimensions which are similar, preferably equal and a third dimension which is significantly less than the other two dimensions. Significantly less in this context is preferably at least a factor of about 100 smaller.

A variety of surface types are known to the person skilled in the art. According to the invention Si substrates with rough surfaces are preferred. One way to assess the roughness of the substrate is to evaluate the surface roughness parameter for a sub-surface of the substrate which is small in comparison to the total surface area of the substrate, preferably less than about one hundredth of the total surface area, and which is essentially planar. The value of the surface roughness parameter is given by the ratio of the area of the subsurface to the area of a theoretical surface formed by projecting that subsurface onto the flat plane best fitted to the subsurface by minimising mean square displacement. A higher value of the surface roughness parameter indicates a rougher, more irregular surface and a lower value of the surface roughness parameter indicates a smoother, more even surface. According to the invention, the surface roughness of the Si substrate is preferably modified so as to produce an optimum balance between a number of factors including but not limited to light absorption and adhesion of fingers to the surface.

The two larger dimensions of the Si substrate can be varied to suit the application required of the resultant solar cell. It is preferred according to the invention for the thickness of the Si wafer to lie below about 0.5 mm more preferably below about 0.3 mm and most preferably below about 0.2 mm. Some wafers have a minimum size of about 0.01 mm or more.

It is preferred according to the invention for the front doped layer to be thin in comparison to the back doped layer. It is preferred according to the invention for the front doped layer to have a thickness lying in a range from about 0.1 to about 10 μm, preferably in a range from about 0.1 to about 5 μm and most preferably in a range from about 0.1 to about 2 μm.

A highly doped layer can be applied to the back face of the Si substrate between the back doped layer and any further layers. Such a highly doped layer is of the same doping type as the back doped layer and such a layer is commonly denoted with a+(n$^+$-type layers are applied to n-type back doped layers and p$^+$-type layers are applied to p-type back doped layers). This highly doped back layer serves to assist metallisation and improve electro-conductive properties at the substrate/electrode interface area. It is preferred according to the invention for the highly doped back layer, if present, to have a thickness in a range from about 1 to about 100 μm, preferably in a range from about 1 to about 50 μm and most preferably in a range from about 1 to about 15 μm.

Dopants

Preferred dopants are those which, when added to the Si wafer, form a p-n junction boundary by introducing electrons or holes into the band structure. It is preferred according to the invention that the identity and concentration of these dopants is specifically selected so as to tune the band structure profile of the p-n junction and set the light absorption and conductivity profiles as required. Preferred p-type dopants according to the invention are those which add holes to the Si wafer band structure. They are well known to the person skilled in the art. All dopants known to the person skilled in the art and which he considers to be suitable in the context of the invention can be employed as p-type dopant. Preferred p-type dopants according to the invention are trivalent elements, particularly those of group 13 of the periodic table. Preferred group 13 elements of the periodic table in this context include but are not limited to B, Al, Ga, In, Ti or a combination of at least two thereof, wherein B is particularly preferred.

Preferred n-type dopants according to the invention are those which add electrons to the Si wafer band structure. They are well known to the person skilled in the art. All dopants known to the person skilled in the art and which he considers to be suitable in the context of the invention can be employed as n-type dopant. Preferred n-type dopants according to the invention are elements of group 15 of the periodic table. Preferred group 15 elements of the periodic table in this context include N, P, As, Sb, Bi or a combination of at least two thereof, wherein P is particularly preferred.

As described above, the various doping levels of the p-n junction can be varied so as to tune the desired properties of the resulting solar cell.

According to the invention, it is preferred for the back doped layer to be lightly doped, preferably with a dopant concentration in a range from about $1 \times 10^{13}$ to about $1 \times 10^{18}$ cm$^{-3}$, preferably in a range from about $1 \times 10^{14}$ to about $1 \times 10^{17}$ cm$^{-3}$, most preferably in a range from about $5 \times 10^{15}$ to about $5 \times 10^{16}$ cm$^{-3}$. Some commercial products have a back doped layer with a dopant concentration of about $1 \times 10^{16}$.

It is preferred according to the invention for the highly doped back layer (if one is present) to be highly doped, preferably with a concentration in a range from about $1 \times 10^{17}$ to about $5 \times 10^{21}$ cm$^{-3}$, more preferably in a range from about $5 \times 10^{17}$ to about $5 \times 10^{20}$ cm$^{-3}$, and most preferably in a range from about $1 \times 10^{18}$ to about $1 \times 10^{20}$ cm$^{-3}$.

Electro-Conductive Paste

Preferred electro-conductive pastes according to the invention are pastes which can be applied to a surface and which, on firing, form solid electrode bodies in electrical contact with that surface. The constituents of the paste and proportions thereof can be selected by the person skilled in the art in order that the paste have the desired properties such as sintering and printability and that the resulting electrode have the desired electrical and physical properties. Metallic particles can be present in the paste, primarily in order that the resulting electrode body be electrically conductive. In order to bring about appropriate sintering through surface layers and into the Si wafer, an inorganic reaction system can be employed. An example composition of an electrically-conductive paste which is preferred in the context of the invention might comprise:

i) metallic particles, preferably at least about 50 wt. %, more preferably at least about 70 wt. % and most preferably at least about 80 wt. %;

ii) inorganic reaction system, preferably in a range from about 0.1 to about 5 wt. %, preferably in a range from 0.3 to 3 wt. %, more preferably in a range from 0.5 to 2 wt. %;

iii) organic vehicle, preferably in a range from about 5 to about 40 wt. %, more preferably in a range from about 5 to about 30 wt. % and most preferably in a range from about 5 to about 15 wt. %;

iv) inorganic oxide particles having no glass transition temperature below about 750° C., preferably no glass transition temperature below about 1000° C., more preferably no glass transition temperature below about 1250° C. or a glass transition temperature which is at least about 50 K higher, preferably at least about 100 K higher, more preferably at least about 200 K higher, than the glass transition temperature of the inorganic reaction system; and v) additives, preferably in a range from about 0.1 to about 22 wt. %, more preferably in a range from about 0.1 to about 15 wt. % and most preferably in a range from about 2 to about 10 wt. %, wherein the wt. % are each based on the total weight of the electro-conductive paste and add up to 100 wt. %.

In order to facilitate printability of the electro-conductive paste, it is preferred according to the invention that the viscosity of the electro-conductive paste lies in a range from about 10 to about 50 Pa·s, preferably in a range from about 20 to about 40 Pa·s, and most preferably in a range from about 20 to about 35 Pa·s.

Inorganic Oxide Particles

Preferred inorganic oxide particles in the context of the invention are those which bring about favourable electrical and mechanical properties in the resultant solar cell, in particular a high electrical resistance between the plug electrode and the Si wafer. The inorganic oxide particles and their proportion in the paste can be selected by the skilled person so as to enhance favourable properties of the resultant solar cell.

It is preferred in the context of the present invention for the inorganic oxide particles to retain their solid form under the firing conditions employed according to this invention. In one embodiment, the inorganic oxide particles have no glass transition temperature below at least about 50 K, preferably at least about 100 K, more preferably at least about 200 K above the glass transition temperature of the inorganic reaction system. In some cases, the inorganic oxide has a glass transition temperature at a temperature above as much as 1000 K above the glass transition temperature of the inorganic reaction system or less. In another embodiment the inorganic oxide particles have no glass transition temperature below a temperature of about 750° C., preferably no glass transition temperature below a temperature of about 1000° C., preferably no glass transition temperature below a temperature of about 1250° C. In another embodiment, inorganic oxide has no glass transition temperature. In another embodiment, the melting point of the inorganic oxide particles is above, preferably at least about 50 K above, more preferably at least about 100 K above, the maximum firing temperature employed. In another embodiment, the melting point of the inorganic oxide is above about 550° C., preferably above about 700° C., more preferably above about 800° C. Preferred inorganic oxides in this context are alkali metal oxides, alkali earth oxides, transition metal oxides, lanthanide metal oxides and non-metal oxides. Preferred oxides in this context are $PbO_2$, $SiO_2$, SeO, MgO, $Al_2O_3$, CaO. In one embodiment, the inorganic oxide is $SiO_2$.

In one embodiment, the inorganic oxide particles are coarse. In one embodiment of the solar cell precursor, at least 50% by weight, preferably at least 70% by weight, more preferably at least 90% by weight, of the inorganic oxide particles reside on a 230 mesh sieve. In another embodiment, the inorganic oxide particles have a $d_{90}$ of at least about 20 µm, preferably at least about 30 µm, more preferably at least about 40 µm. In some cases $d_{90}$ for the inorganic oxide particles can be a high as at least about 80 µm or less.

Metallic Particles

Preferred metallic particles in the context of the invention are those which exhibit metallic conductivity or which yield a substance which exhibits metallic conductivity on firing. Metallic particles present in the electro-conductive paste give metallic conductivity to the solid electrode which is formed when the electro-conductive paste is sintered on firing. Metallic particles which favour effective sintering and yield electrodes with high conductivity and low contact resistance are preferred. Metallic particles are well known to the person skilled in the art. All metallic particles known to the person skilled in the art and which he considers suitable in the context of the invention can be employed as the metallic particles in the electro-conductive paste. Preferred metallic particles according to the invention are metals, alloys, mixtures of at least two metals, mixtures of at least two alloys or mixtures of at least one metal with at least one alloy.

Preferred metals which can be employed as metallic particles according to the invention are Ag, Cu, Al, Zn, Pd, Ni or Pb and mixtures of at least two thereof, preferably Ag. Preferred alloys which can be employed as metallic particles according to the invention are alloys containing at least one metal selected from the list of Ag, Cu, Al, Zn, Ni, W, Pb and Pd or mixtures or two or more of those alloys.

In one embodiment according to the invention, the metallic particles comprise a metal or alloy coated with one or more further different metals or alloys, for example copper coated with silver.

In one embodiment according to the invention, the metallic particles are Ag. In another embodiment according to the invention, the metallic particles comprise a mixture of Ag with Al.

As additional constituents of the metallic particles, further to above mentioned constituents, those constituents which contribute to more favourable sintering properties, electrical contact, adhesion and electrical conductivity of the formed electrodes are preferred according to the invention. All additional constituents known to the person skilled in the art and which he considers to be suitable in the context of the invention can be employed in the metallic particles. Those additional substituents which represent complementary dopants for the face to which the electro-conductive paste is applied are preferred according to the invention. When forming an electrode interfacing with an n-type doped Si layer, additives capable of acting as n-type dopants in Si are preferred. Preferred n-type dopants in this context are group 15 elements or compounds which yield such elements on firing. Preferred group 15 elements in this context according to the invention are P and Bi. When forming an electrode interfacing with a p-type doped Si layer, additives capable of acting as p-type dopants in Si are preferred. Preferred p-type dopants are group 13 elements or compounds which yield such elements on firing. Preferred group 13 elements in this context according to the invention are B and Al.

It is well known to the person skilled in the art that metallic particles can exhibit a variety of shapes, surfaces, sizes, surface area to volume ratios, oxygen content and oxide layers. A large number of shapes are known to the person skilled in the art. Some examples are spherical, angular, elongated (rod or needle like) and flat (sheet like). Metallic particles may also be present as a combination of particles of different shapes. Metallic particles with a shape, or combination of shapes, which favours advantageous sintering, electrical contact, adhesion and electrical conductivity of the produced electrode are preferred according to the invention. One way to characterise such shapes without considering surface nature is through the parameters length, width and thickness. In the context of the invention the length of a particle is given by the length of the longest spatial displacement vector, both endpoints of which are contained within the particle. The width of a particle is given by the length of the longest spatial displacement vector perpendicular to the length vector defined above both endpoints of which are contained within the particle. The thickness of a particle is given by the length of the longest spatial displacement vector perpendicular to both the length vector and the width vector, both defined above, both endpoints of which are contained within the particle. In one embodiment according to the invention, metallic particles with shapes as uniform as possible are preferred i.e. shapes in which the ratios relating the length, the width and the thickness are as close as possible to 1, preferably all ratios lying in a range from about 0.7 to about 1.5, more preferably in a range from about 0.8 to about 1.3 and most preferably in a range from about 0.9 to about 1.2. Examples of preferred shapes for the metallic particles in this embodiment are therefore spheres and cubes, or combinations thereof, or combinations of one or more thereof with other shapes. In another embodiment according to the invention, metallic particles are preferred which have a shape of low uniformity, preferably with at least one of the ratios relating the dimensions of length, width and thickness being above about 1.5, more preferably above about 3 and most preferably above about 5. Preferred shapes according to this embodiment are flake shaped, rod or needle shaped, or a combination of flake shaped, rod or needle shaped with other shapes.

A variety of surface types are known to the person skilled in the art. Surface types which favour effective sintering and yield advantageous electrical contact and conductivity of produced electrodes are favoured for the surface type of the metallic particles according to the invention.

Another way to characterise the shape and surface of the metallic particle is by the surface area to mass ratio, commonly known as specific surface area. In one embodiment according to the invention, the metallic particles preferably have a specific surface area in a range from about 0.01 to about 2 $m^2/g$, preferably in a range from about 0.05 to about 1 $m^2/g$ and more preferably in a range from about 0.1 to about 0.5 $m^2/g$.

The particles diameter $d_{50}$ and the associated values $d_{10}$ and $d_{90}$ are characteristics of particles well known to the person skilled in the art. It is preferred according to the invention that the average particle diameter $d_{50}$ of the metallic particles lie in a range from about 0.5 to about 15 µm, more preferably in a range from about 1 to about 13 µm and most preferably in a range from about 1 to about 10 µm. The determination of the particle diameter $d_{50}$ is well known to a person skilled in the art.

The metallic particles may be present with a surface coating. Any such coating known to the person skilled in the art and which he considers to be suitable in the context of the invention can be employed on the metallic particles. Preferred coatings according to the invention are those coatings which promote improved printing, sintering and etching characteristics of the electro-conductive paste. If such a coating is present, it is preferred according to the invention for that coating to correspond to no more than about 10 wt. %, preferably no more than about 8 wt. %, most preferably no more than about 5 wt. %, in each case based on the total weight of the metallic particles.

In one embodiment according to the invention, the metallic particles are present as a proportion of the electro-conductive paste more than about 50 wt. %, preferably more than about 70 wt. %, most preferably more than about 80 wt. %.

Inorganic Reaction System

An inorganic reaction system is present in the electro-conductive paste according to the invention in order to bring about etching and sintering. Effective etching is required to etch any additional layers which may have been applied to the Si wafer and thus lie between the front doped layer and the applied electro-conductive paste and/or to etch into the Si wafer to an appropriate extent. Appropriate etching of the Si wafer means deep enough to bring about good mechanical contact but not to bring about good electrical contact between the electrode and the silicon wafer and thus lead to a high contact resistance. Preferred inorganic reaction systems are glass frits.

In one embodiment of the solar cell precursor according to the invention, the inorganic reaction system is glass frit.

Preferred glass frits in the context of the invention are powders of amorphous or partially crystalline solids which exhibit a glass transition. The glass transition temperature $T_g$ is the temperature at which an amorphous substance transforms from a rigid solid to a partially mobile undercooled melt upon heating. Methods for the determination of the glass transition temperature are well known to the person skilled in the art. The etching and sintering brought about by the glass frit occurs above the glass transition temperature of the glass frit and the glass transition temperature must lie below the desired peak firing temperature. Glass fits are well known to the person skilled in the art. All glass frits known to the person skilled in the art and which he considers suitable in the context of the invention can be employed as the glass frit in the electro-conductive paste.

In the context of the invention, the inorganic reaction system present in the electro-conductive paste preferably comprises elements, oxides, compounds which generate oxides on heating, other compounds, or mixtures thereof. Preferred elements in this context are Si, B, Al, Bi, Li, Na, Mg, Pb, Zn, Gd, Ce, Zr, Ti, Mn, Sn, Ru, Co, Fe, Cu, Ba and Cr or mixtures of two or more from this list. Preferred oxides which can be comprised by the invention in the context of the invention are alkali metal oxides, alkali earth metal oxides, rare earth oxides, group V and group VI oxides, other oxides, or combinations thereof. Preferred alkali metal oxides in this context are sodium oxide, lithium oxide, potassium oxide, rubidium oxides, caesium oxides or combinations thereof. Preferred alkali earth metal oxides in this context are beryllium oxide, magnesium oxide, calcium oxide, strontium oxide, barium oxide, or combinations thereof. Preferred group V oxides in this context are phosphorous oxides, such as $P_2O_5$, bismuth oxides, such as $Bi_2O_3$, or combinations thereof. Preferred group VI oxides in this context are tellurium oxides, such as $TeO_2$, or $TeO_3$, selenium oxides, such as $SeO_2$, or combinations thereof. Preferred rare earth oxides are cerium oxides, such as $CeO_2$ and lanthanum oxides, such as $La_2O_3$.

Other preferred oxides in this context are silicon oxides, such as $SiO_2$, zinc oxides, such as ZnO, aluminium oxides, such as $Al_2O_3$, germanium oxides, such as $GeO_2$, vanadium oxides, such as $V_2O_5$, niobium oxides, such as $Nb_2O_5$, boron oxide, tungsten oxides, such as $WO_3$, molybdenum oxides, such as $MoO_3$, and indium oxides, such as $In_2O_3$, further oxides of those elements listed above as preferred elements, or combinations thereof. Preferred oxides are also mixed oxides containing at least two of the elements listed as preferred elemental constituents of the frit glass, or mixed oxides which are formed by heating at least one of the above named oxides with at least one of the above named metals. Mixtures of at least two of the above-listed oxides and mixed oxides are also preferred in the context of the invention.

As mentioned above, where the inorganic reaction system is a glass frit, it must have a glass transition temperature below the desired firing temperature of the electro-conductive paste. According to the invention, preferred glass frits have a glass transition temperature in a range between about 250° C. and about 750° C., preferably in a range from about 300° C. to about 730° C. and most preferably in a range from about 350° C. to about 690° C.

A way to characterise the shape and surface of the inorganic reaction system is by the surface area to mass ratio, commonly known as specific surface area. In one embodiment according to the invention, the inorganic reaction system particles preferably have a specific surface area in a range from about 0.01 to about 5 $m^2/g$, preferably in a range from about 0.05 to about 3 $m^2/g$ and more preferably in a range from about 0.1 to about 1 $m^2/g$.

The average particles diameter $d_{50}$, and the associated parameters $d_{10}$ and $d_{90}$ are characteristics of particles well known to the person skilled in the art. It is preferred according to the invention that the average particle diameter $d_{50}$ of the inorganic reaction system lies in a range from about 0.1 to about 10 μm, more preferably in a range from about 0.5 to about 7 μm and most preferably in a range from about 0.8 to about 5 μm. The determination of the particles diameter $d_{50}$ is well known to the person skilled in the art.

In one embodiment of the invention, the inorganic reaction system is present in the paste in a range from about 0.1 to about 15 wt. %.

In some cases it is preferred for the glass frit to be present in low concentrations. In one embodiment of the solar cell precursor according to the invention, the inorganic reaction system is present in the paste in a range from about 0.1 to about 5 wt. %, preferably in a range from 0.3 to 3 wt. %, more preferably in a range from 0.5 to 2 wt. %.

Organic Vehicle

Preferred organic vehicles in the context of the invention are solutions, emulsions or dispersions based on one or more solvents, preferably an organic solvent, which ensure that the constituents of the electro-conductive paste are present in a dissolved, emulsified or dispersed form. Preferred organic vehicles are those which provide optimal stability of constituents within the electro-conductive paste and endow the electro-conductive paste with a viscosity allowing effective line printability. Preferred organic vehicles according to the invention comprise as vehicle components:

(i) a binder, preferably in a range from about 1 to about 10 wt. %, more preferably in a range from about 2 to about 8 wt. % and most preferably in a range from about 3 to about 7 wt. %;

(ii) a surfactant, preferably in a range from about 0 to about 10 wt. %, more preferably in a range from about 0 to about 8 wt. % and most preferably in a range from about 0.01 to about 6 wt. %;

(ii) one or more solvents, the proportion of which is determined by the proportions of the other constituents in the organic vehicle;

(iv) additives, preferably in range from about 0 to about 15 wt. %, more preferably in a range from about 0 to about 13 wt. % and most preferably in a range from about 5 to about 11 wt. %, wherein the wt. % are each based on the total weight of the organic vehicle and add up to 100 wt. %. According to the invention preferred organic vehicles are those which allow for the preferred high level of printability of the electro-conductive paste described above to be achieved.

Binder

Preferred binders in the context of the invention are those which contribute to the formation of an electro-conductive paste with favourable stability, printability, viscosity, sintering and etching properties. Binders are well known to the person skilled in the art. All binders which are known to the person skilled in the art and which he considers to be suitable in the context of this invention can be employed as the binder in the organic vehicle. Preferred binders according to the invention (which often fall within the category termed "resins") are polymeric binders, monomeric binders, and binders which are a combination of polymers and monomers. Polymeric binders can also be copolymers wherein at least two different monomeric units are contained in a single molecule. Preferred polymeric binders are those which carry functional groups in the polymer main chain, those which carry functional groups off of the main chain and those which carry functional groups both within the main chain and off of the main chain. Preferred polymers carrying functional groups in the main chain are for example polyesters, substituted polyesters, polycarbonates, substituted polycarbonates, polymers which carry cyclic groups in the main chain, poly-sugars, substituted poly-sugars, polyurethanes, substituted polyurethanes, polyamides, substituted polyamides, phenolic resins, substituted phenolic resins, copolymers of the monomers of one or more of the preceding polymers, optionally with other co-monomers, or a combination of at least two thereof. Preferred polymers which carry cyclic groups in the main chain are for example polyvinylbutylate (PVB) and its derivatives and poly-terpineol and its derivatives or mixtures thereof. Preferred poly-sugars are for example cellulose and alkyl derivatives thereof, preferably methyl cellulose, ethyl cellulose, propyl cellulose, butyl cellulose and their derivatives and mixtures of at least two thereof. Preferred polymers which carry functional groups off of the main polymer chain are those which carry amide groups, those which carry acid and/or ester groups, often called acrylic resins, or polymers which carry a combination of aforementioned functional groups, or a combination thereof. Preferred polymers which carry amide off of the main chain are for example polyvinyl pyrrolidone (PVP) and its derivatives. Preferred polymers which carry acid and/or ester groups off of the main chain are for example polyacrylic acid and its derivatives, polymethacrylate (PMA) and its derivatives or polymethylmethacrylate (PMMA) and its derivatives, or a mixture thereof. Preferred monomeric binders according to the invention are ethylene glycol based monomers, terpineol resins or rosin derivatives, or a mixture thereof. Preferred monomeric binders based on ethylene glycol are those with ether groups, ester groups or those with an ether group and an ester group, preferred ether groups being methyl, ethyl, propyl, butyl, pentyl hexyl and higher alkyl ethers, the preferred ester group being acetate and its alkyl derivatives, preferably ethylene glycol monobutylether monoacetate or a mixture thereof. Alkyl cellulose, preferably ethyl cellulose, its derivatives and mixtures thereof with other binders from the preceding lists of binders or otherwise are the most preferred binders in the context of the invention.

Surfactant

Preferred surfactants in the context of the invention are those which contribute to the formation of an electro-conductive paste with favourable stability, printability, viscosity, sintering and etching properties. Surfactants are well known to the person skilled in the art. All surfactants which are known to the person skilled in the art and which he considers to be suitable in the context of this invention can be employed as the surfactant in the organic vehicle. Preferred surfactants in the context of the invention are those based on linear chains, branched chains, aromatic chains, fluorinated chains, siloxane chains, polyether chains and combinations thereof. Preferred surfactants are single chained double chained or poly chained. Preferred surfactants according to the invention have non-ionic, anionic, cationic, or zwitterionic heads. Preferred surfactants are polymeric and monomeric or a mixture thereof. Preferred surfactants according to the invention can have pigment affinic groups, preferably hydroxyfunctional carboxylic acid esters with pigment affinic groups, acrylate copolymers with pigment affinic groups, modified polyethers with pigment affinic groups, other surfactants with groups of high pigment affinity. Other preferred polymers according to the invention not in the above list are polyethyleneglycol and its derivatives, and alkyl carboxylic acids and their derivatives or salts, or mixtures thereof. The preferred polyethyleneglycol derivative according to the invention is poly(ethyleneglycol) acetic acid. Preferred alkyl carboxylic acids are those with fully saturated and those with singly or poly unsaturated alkyl chains or mixtures thereof. Preferred carboxylic acids with saturated alkyl chains are those with alkyl chains lengths in a range from about 8 to about 20 carbon atoms, preferably $C_9H_{19}COOH$ (capric acid), $C_{11}H_{23}COOH$ (Lauric acid), $C_{13}H_{27}COOH$ (myristic acid) $C_{15}H_{31}COOH$ (palmitic acid), $C_{17}H_{35}COOH$ (stearic acid) or mixtures thereof. Preferred carboxylic acids with unsaturated alkyl chains are $C_{18}H_{34}O_2$ (oleic acid) and $C_{18}H_{32}O_2$ (linoleic acid). The preferred monomeric surfactant according to the invention is benzotriazole and its derivatives.

Solvent

Preferred solvents according to the invention are constituents of the electro-conductive paste which are removed from the paste to a significant extent during firing, preferably those which are present after firing with an absolute weight reduced by at least about 80% compared to before firing, preferably reduced by at least about 95% compared to before firing. Preferred solvents according to the invention are those which allow an electro-conductive paste to be formed which has favourable viscosity, printability, stability and sintering characteristics and which yields electrodes with favourable electrical conductivity and electrical contact to the substrate. Solvents are well known to the person skilled in the art. All solvents which are known to the person skilled in the art and which he considers to be suitable in the context of this invention can be employed as the solvent in the organic vehicle. According to the invention preferred solvents are those which allow the preferred high level of printability of the electro-conductive paste as described above to be achieved. Preferred solvents according to the invention are those which exist as a liquid under standard temperature and pressure (SATP) (298.15 K, 25° C., 77° F.), 100 kPa (14.504 psi, 0.986 atm), preferably those with a boiling point above about 90° C. and a melting point above about −20° C. Preferred solvents according to the invention are polar or non-polar, protic or aprotic, aromatic or non-aromatic. Preferred solvents according to the invention are mono-alcohols, di-alcohols, poly-alcohols, mono-esters, diesters, poly-esters, mono-ethers, di-ethers, poly-ethers, solvents which comprise at least one or more of these categories of functional group, optionally comprising other categories of functional group, preferably cyclic groups, aromatic groups, unsaturated-bonds, alcohol groups with one or more 0 atoms replaced by heteroatoms, ether groups with one or more 0 atoms replaced by heteroatoms, esters groups with one or more 0 atoms replaced by heteroatoms, and mixtures of two or more of the aforementioned solvents. Preferred esters in this context are di-alkyl esters of adipic acid, preferred alkyl constituents being methyl, ethyl, propyl, butyl, pentyl, hexyl and higher alkyl groups or combinations of two different such alkyl groups, preferably dimethyladipate, and mixtures of two or more adipate esters. Preferred ethers in this context are diethers, preferably dialkyl ethers of ethylene glycol, preferred alkyl constituents being methyl, ethyl, propyl, butyl, pentyl, hexyl and higher alkyl groups or combinations of two different such alkyl groups, and mixtures of two diethers. Preferred alcohols in this context are primary, secondary and tertiary alcohols, preferably tertiary alcohols, terpineol and its derivatives being preferred, or a mixture of two or more alcohols. Preferred solvents which combine more than one different functional groups are 2,2,4-trimethyl-1,3-pentanediol monoisobutyrate, often called texanol, and its derivatives, 2-(2-ethoxyethoxyl)ethanol, often known as carbitol, its alkyl derivatives, preferably methyl, ethyl, propyl, butyl, pentyl, and hexyl carbitol, preferably hexyl carbitol or butyl carbitol, and acetate derivatives thereof, preferably butyl carbitol acetate, or mixtures of at least 2 of the aforementioned.

Additives in the Organic Vehicle

Preferred additives in the organic vehicle are those additives which are distinct from the aforementioned vehicle components and which contribute to favourable properties of the electro-conductive paste, such as advantageous viscosity, sintering, electrical conductivity of the produced electrode and good electrical contact with substrates. All additives known to the person skilled in the art and which he considers to be suitable in the context of the invention can be employed as additive in the organic vehicle. Preferred additives according to the invention are thixotropic agents, viscosity regulators, stabilising agents, inorganic additives, thickeners, emulsifiers, dispersants or pH regulators. Preferred thixotropic agents in this context are carboxylic acid derivatives, preferably fatty acid derivatives or combinations thereof. Preferred fatty acid derivatives are $C_9H_{19}COOH$ (capric acid), $C_{11}H_{23}COOH$ (Lauric acid), $C_{13}H_{27}COOH$ (myristic acid) $C_{15}H_{31}COOH$ (palmitic acid), $C_{17}H_{35}COOH$ (stearic acid) $C_{18}H_{34}O_2$ (oleic acid), $C_{18}H_{32}O_2$ (linoleic acid) or combinations thereof. A preferred combination comprising fatty acids in this context is castor oil.

Additives in the Electro-Conductive Paste

Preferred additives in the context of the invention are constituents added to the electroconductive paste, in addition to the other constituents explicitly mentioned, in particular, the inorganic oxide according to the invention, which contribute to increased performance of the electro-conductive paste, of the electrodes produced thereof or of the resulting solar cell. All additives known to the person skilled in the art and which he considers suitable in the context of the invention can be employed as additive in the electro-conductive paste. In addition to additives present in the vehicle, additives can also be present in the electro-conductive paste. Preferred additives according to the invention are thixotropic agents, viscosity regulators, emulsifiers, stabilising agents or pH regulators, inorganic additives, thickeners and dispersants or a combination of at least two thereof, whereas inorganic additives are most preferred. One group of preferred inorganic additives in this context according to the invention are Mg, Ni, Te, W, Zn, Mg, Gd, Ce, Zr, Ti, Mn, Sn, Ru, Co, Fe, Cu and Cr or a combination of at least two thereof, preferably Zn, Sb, Mn, Ni, W, Te and Ru or a combination of at least two thereof, oxides thereof, compounds which can generate those metal oxides on firing, or a mixture of at least two of the aforementioned metals, a mixture of at least two of the aforementioned oxides, a mixture of at least two of the aforementioned compounds which can generate those metal oxides on firing, or mixtures of two or more of any of the above mentioned. A second group of preferred inorganic additives, described in a separate section below, are vanadium containing compounds. A third group of preferred inorganic additives, described in a separate section below, are phosphorus containing materials. The preferred additives according to the present invention are vanadium containing compounds, phosphorus containing materials, or a combination of both, preferably a combination of both.

Phosphorus Containing Material

It is preferred according to the invention for a phosphorus containing material selected from the group consisting of elemental phosphorus, a phosphorus containing compound, or a combination thereof, to be present in at least one of the paste constituents. The nature and amount of the phosphorus containing material can be selected by the skilled person so as to bring about favourable characteristics in the solar cell obtained according to the invention, in particular a low electrical conductivity and a high adhesion between the electrode in the channel and the Si surface. Preferred forms of elemental phosphorus in this context are white phosphorus, red phosphorus, black phosphorus, violet phosphorus, dark red phosphorus, vitreous grey phosphorus, brown phosphorus, scarlet phosphorus or combinations thereof, preferably red phosphorus. Preferred forms of elemental phosphorus are crystalline, amorphous or a combination of both, preferably amorphous. Amorphous red phosphorus is preferred according to the invention.

In one embodiment of the invention, the phosphorus containing material is red phosphorus. In a further embodiment, elemental phosphorus, preferably red phosphorus is combined with a vanadium containing compound, said vanadium containing compound preferably being selected from the list of vanadium containing compounds detailed below.

Preferred phosphorus containing compounds in this context are oxides, sulphides, selenides, halides, oxyacids, salts of oxyacids, or combinations thereof, preferably oxides. Preferred halides in this context are $PCl_3$, $PBr_3$, $PI_3$, $P_2Cl_4$, $P_2I_4$, $PCl_5$, $PBr_5$, $PI_5$, substituted derivatives of any of the above, or combinations thereof. Preferred oxides in this context are $P_4O_6$, $P_4O_7$, $P_4O_8$, $P_4O_9$, $P_2O_5/P_4O_{10}$ or combinations thereof, preferably $P_2O_5/P_4O_{10}$. Preferred sulphides in this context are $P_4S_2$, $P_3S_3$, $P_4S_4$, $P_4S_5$, $P_4S_7$, $P_4S_9$, $P_4S_{10}$, or combinations thereof, preferably $P_4S_3$. Preferred oxyacids in this context are $H_3PO_2$, $H_3PO_3$, $H_4P_2O_6$, $H_3PO_4$ and combinations thereof, preferably $H_3PO_4$. Preferred salts in this context are those with $H_2PO_2^-$, $HPO_3^{2-}$, $H_2P_2O_6^{2-}$, $PO_4^{3-}$, or combinations thereof as anion, preferably $PO_4^{3-}$. Preferred cations in this context are monovalent or polyvalent cations, or combinations thereof, preferably monovalent cations. Preferred monovalent cations in this context are alkali metal cations, preferably $Na^+$ or $K^+$, or combinations thereof, preferably $Na^+$.

In one embodiment of the invention, the phosphorus containing material is phosphorus oxide. In a further embodiment, phosphorus oxide is combined with a vanadium containing compound, said vanadium containing compound preferably being selected from the list of vanadium containing compounds detailed below.

In one embodiment of the solar cell precursor according to the invention, the phosphorus containing material is red phosphorus or phosphorus oxide.

The phosphorus containing material is preferably present in at least one of the paste constituents, either as part of a composite material, such as a glass frit, or as a separate compound. It is preferred according to the invention that the phosphorus containing material be present as a separate additive, not as part of a composite material.

Vanadium Containing Compound

It is preferred according to the invention for a vanadium containing compound to be present in at least one of the paste constituents. The nature and amount of the vanadium containing compound can be selected by the skilled person so as to bring about favourable characteristics in the solar cell obtained according to the invention, in particular a low electrical conductivity and a high physical adhesion between the electrode in the channel and the Si surface. Preferred vanadium containing compound in this context are oxides, halides, oxohalides, sulphides, selenides, telurides, vanadates, and organo-metallics, or combinations thereof, preferably oxides. Preferred oxides are $V_2O_5$, $VO_2$, $V_2O_3$, and $VO$ or combinations thereof, preferably $V_2O_5$. Preferred vanadates are $VO_4^{3-}$, $VO_2O_7^{4-}$, $HVO_4^{2-}$, $V_4O_{12}^{4-}$, $V_3O_9^{3-}$, $V_3O_9^{4-}$, $HV_{10}O_{28}^{5-}$, $H_2VO_4{-}$, $HV_{10}O_{28}^{5-}$, $H_2V_{10}O_{28}^{4-}$, $VO_2^+$, $H_3VO_4$. Preferred counter ions in this context are $Na^+$, $K^+$ or halide as appropriate. Preferred sulphides are $V_3S$, $V_5S_4$, $VS$, $V_7S_8$, and $V_3S_4$. Preferred selenides are $V_2Se$, $V_5Se_4$, $VSe$, $v_7Se_8$, $V_3Se_4$, $V_{25}Se_8$, and $VSe_2$. Preferred tellurides are $V_3Te_4$, $V_3Te_4$, $V_2Te_3$, $V_5T_{38}$, and $VTe_2$. Preferred halides are $VF_5$, $VF_4$, $VCl_4$, $VBr_4$, $VF_3$, $VCl_3$, $VBr_3$, $VI_3$, $VF_2$, $VCl_2$, $VBr_2$, and $VI_2$. Preferred oxyhalides are $VOF_3$, $VO_2F$, $VOCl_3$, $VO_2Cl$, $VOBr_3$, $VOF_2$, $VOCl_2$, $VOBr_2$, $VOCl$, and $VOBr$.

In one embodiment of the solar cell precursor according to the invention, the vanadium containing compound is $V_2O_5$. In a further embodiment, $V_2O_5$ is combined with a phosphorus containing material, said phosphorus containing material preferably being selected from the list of phosphorus containing materials detailed above.

The vanadium containing compound is preferably present in at least one of the paste constituents, either as part of a composite material, such as a glass frit, or as a separate compound. It is preferred according to the invention that the vanadium containing compound be present as a separate additive, not as part of a composite material.

Solar Cell Precursor

A contribution to achieving at least one of the above described objects is made by a solar cell precursor. MWT type solar cell precursors are preferred in the context of the invention. In such a precursor, a first electro-conductive paste as described above is present in at least one channel joining the front and back of a wafer. A second electro-conductive paste, which may be the same as or different to the first paste, is present on the front of the solar cell and makes contact with the paste in the channel. A third electro-conductive paste which may be the same as or different to the first and second pastes is present on the back face of the solar cell and does not make contact with the first paste.

In one embodiment of the solar cell precursor according to the invention, a further electroconductive paste is present on the front face of the wafer. In another embodiment, at least one further electro-conductive paste is present on the back face of the wafer. In a further embodiment, further pastes are present on both the back and the front faces of the wafer.

In this application, the terms channel is often used in place of the more general term hole. All descriptions referring to channels apply equally to holes.

In one embodiment of the solar cell precursor according to the invention, at least one hole is a channel joining the front face and the back face of the wafer.

The making of a hole in the Si wafer may be effected by any means known to the skilled person and which he considers suitable in the context of the invention. Preferred methods according to the invention are cutting, etching, heating, melting, burning, boring, piercing, stamping or drilling, such as mechanical drilling or laser drilling, or a combination of at least two thereof, preferably drilling, more preferably laser drilling.

The hole in the Si wafer can have a number of cross-sectional shapes. Any cross-sectional shape known to the skilled person and which he considers suitable in the context of the invention can be employed. Preferred cross-sectional shapes for the hole according to the invention are polygonal and non-polygonal. Preferred polygonal shapes are triangle, square, oblong or other regular or irregular polygons. Preferred non-polygonal shapes are circular or oval or other non-polygonal shapes. The preferred cross-sectional shape according to the invention is circular.

The effective cross-section diameter of the hole in the Si wafer can be altered by the skilled person so as to maximum the performance of the resultant solar cell. Where the cross-sectional shape is not circular, the effective diameter is given as the diameter of a hypothetical circle with an area equal to the cross-sectional area of the hole. It is preferred in the context of the invention that the cross-sectional area of the hole be in a range from about 10 to about 500 µm, more preferably in a range from about 20 to about 300 µm, most preferably in a range from about 30 to about 250 µm.

FIG. 1 exemplifies a common layer configuration for a solar cell according to the invention (excluding additional layers which server purely for chemical and mechanical protection). Individual layers can be added to or omitted from this common layer configuration or individual layers can indeed perform the function of more than one of the layers shown in FIG. 1. In one embodiment of the invention, a single layer acts as both anti-reflection layer and passivation layer. FIG. 2 exemplifies another common layer configuration, wherein a number of layers shown in FIG. 1 have been omitted.

Optionally, one or more of the layers present on the front face of the wafer, such as the front doped layer, the front passivation layer, and the anti-reflection layer, may extend further along the surface of the channel than into the bulk of the front face. In this context, additional coverage of the surface of the channel is taken as meaning surface coverage which extends into the channel by a distance greater by at least 5% than the median thickness of the layer in the bulk of the front face. Additional coverage of the surface of the channel may correspond to full or partial coverage of the additional surface of the channel. The presence or absence of additional surface coverage by front face layers on the surface of the channel can be achieved by altering the sequence in which:

the front doped layer is applied to the wafer;
additional layers, such as passivation layer, and anti-reflection layer are applied to the wafer;
channels are made in the wafer;
faces are cut from the wafer.

In one embodiment of the present invention, no front face layers have additional coverage on the surface of the channel.

In one embodiment of the solar cell precursor according to the invention, the paste is in direct contact with the Si surface of the hole.

In one embodiment of the solar cell precursor according to the invention, the Si surface in at least one hole comprises at least a p-type doped section and an n-type doped section.

As exemplified in FIG. 5, a preparation of a wafer in which no front face layers have additional coverage on the surface of the channel can be achieved by the following sequence of steps:

front doped layer applied;
front passivation layer and anti-reflection layer applied;
channel made;
back and side faces cut to remove front doped layer, passivation layer and anti-reflection layer therefrom.

In one embodiment of the invention, the front doped layer is present with additional coverage of the surface of the channel. In one aspect of this embodiment, a passivation layer is also present with additional coverage of on the surface of the channel. In a further aspect of this embodiment an anti-reflection layer is present with additional coverage on the surface of the channel. As exemplified in FIG. 4, a preparation of a wafer in which front doped layer, passivation layer and anti-reflection layer are all present on the entire surface of the channel can be achieved by the following sequence of steps:

channel made;
front doped layer applied;
front passivation layer and anti-reflection layer applied;
back and side faces cut to remove front doped layer, passivation layer and anti-reflection layer therefrom.

Process for Producing a Solar Cell

A contribution to achieving at one of the aforementioned objects is made by a process for producing a solar cell at least comprising the following as process steps:

i) provision of a solar cell precursor as described above, in particular combining any of the above described embodiments; and ii) firing of the solar cell precursor to obtain a solar cell.

It is preferred according to the invention for formation of the p-n junction in the wafer to precede the making of the hole. In one embodiment, the provision according to step i) at least comprises the steps:
a) provision of a Si wafer with a back doped layer and a front doped layer of opposite doping types;
b) making of at least one hole in the wafer;
c) introduction of an electro-conductive paste into at least one hole to give a precursor according to the invention;

Printing

It is preferred according to the invention that each of the front, back and plug electrodes be applied by applying an electro-conductive paste and then firing that electro-conductive paste to obtain a sintered body. The electro-conductive paste can be applied in any manner known to the person skilled in that art and which he considers suitable in the context of the invention including but not limited to impregnation, dipping, pouring, dripping on, injection, spraying, knife coating, curtain coating, brushing or printing or a combination of at least two thereof, wherein preferred printing techniques are ink-jet printing, screen printing, tampon printing, offset printing, relief printing or stencil printing or a combination of at least two thereof. It is preferred according to the invention that the electro-conductive paste is applied by printing, preferably by screen printing. It is preferred according to the invention that the screens have mesh opening with a diameter in a range from about 20 to about 100 µm, more preferably in a range from about 30 to about 80 µm, and most preferably in a range from about 40 to about 70 µm. As detailed in the solar cell precursor section, it is preferred for the electro-conductive paste applied to the channel to be as described in this invention. The electro-conductive pastes used to form the front and back electrodes can be the same or different to the paste used in the channel, preferably different, and can be the same as or different to each other.

Firing

It is preferred according to the invention for electrodes to be formed by first applying an electro-conductive paste and then firing said electro-conductive paste to yield a solid electrode body. Firing is well known to the person skilled in the art and can be effected in any manner known to him and which he considers suitable in the context of the invention. Where glass frit is used as the inorganic reaction system, it is preferred for firing to be carried out above the glass transition temperature of the glass frit.

According to the invention the maximum temperature set for the firing is below about 900° C., preferably below about 860° C. Firing temperatures as low as about 820° C. have been employed for obtaining solar cells. It is preferred according to the invention for firing to be carried out in a fast firing process with a total firing time in a range from about 30 s to about 3 minutes, more preferably in a range from about 30 s to about 2 minutes and most preferably in a range from about 40 s to about 1 minute. The time above about 600° C. is most preferably in a range from about 3 to about 7 s.

Firing of electro-conductive pastes on the front face, back face and in the hole can be carried out simultaneously or sequentially. Simultaneous firing is appropriate if the electro-conductive pastes have similar, preferably identical, optimum firing conditions. Where appropriate, it is preferred according to the invention for firing to be carried out simultaneously.

Solar Cell

A contribution to achieving at least one of the above described objects is made by a solar cell obtainable by a process according to the invention. Preferred solar cells according to the invention are those which have a high efficiency in terms of proportion of total energy of incident light converted into electrical energy output and which are light and durable.

Anti-Reflection Coating

According to the invention, an anti-reflection coating can be applied as the outer and often as the outermost layer before the electrode on the front face of the solar cell. Preferred anti-reflection coatings according to the invention are those which decrease the proportion of incident light reflected by the front face and increase the proportion of incident light crossing the front face to be absorbed by the wafer. Anti-reflection coatings which give rise to a favourable absorption/reflection ratio, are susceptible to etching by the employed electro-conductive paste but are otherwise resistant to the temperatures required for firing of the electro-conductive paste, and do not contribute to increased recombination of electrons and holes in the vicinity of the electrode interface are favoured. All anti-reflection coatings known to the person skilled in the art and which he considers to be suitable in the context of the invention can be employed. Preferred anti-reflection coatings according to the invention are $SiN_x$, $SiO_2$, $Al_2O_3$, $TiO_2$ or mixtures of at least two thereof and/or combinations of at least two layers thereof, wherein $SiN_x$ is particularly preferred, in particular where an Si wafer is employed.

The thickness of anti-reflection coatings is suited to the wavelength of the appropriate light. According to the invention it is preferred for anti-reflection coatings to have a thickness in a range from about 20 to about 300 nm, more preferably in a range from about 40 to about 200 nm and most preferably in a range from about 60 to about 90 nm.

Passivation Layers

According to the invention, one or more passivation layers can be applied to the front and/or back side as outer or as the outermost layer before the electrode, or before the anti-reflection layer if one is present. Preferred passivation layers are those which reduce the rate of electron/hole recombination in the vicinity of the electrode interface. Any passivation layer which is known to the person skilled in the art and which he considers to be suitable in the context of the invention can be employed. Preferred passivation layers according to the invention are silicon nitride, silicon dioxide and titanium dioxide, silicon nitride being most preferred. According to the invention, it is preferred for the passivation layer to have a thickness in a range from about 0.1 nm to about 2 µm, more preferably in a range from about 10 nm to about 1 µm and most preferably in a range from about 30 nm to about 200 nm.

Electrodes

It is preferred according to the invention for the inorganic oxide particles to remain in the plug electrode. A contribution to achieving at least one of the above described objects is made by a solar cell with at least one hole comprising an electrode comprising at least one region of the inorganic oxide. In one embodiment at least one such region has a concentration of inorganic oxide of at least about 50 Vol. %, preferably at least about 80 Vol. %, more preferably at least about 90 Vol. %. In another embodiment, at least one such region has a volume of at least about $10^{-15}$ m$^3$, preferably at least about $10^{-14}$ m$^3$, more preferably at least about $10^{13}$ m$^3$. In some cases such regions have a volume as great as about $10^{-12}$ m$^3$ or less.

It is preferred for the plug electrode in the solar cell to have an accumulation of glass at the boundary where the electrode meets the Si wafer, preferably in the form of an electrically insulating layer of glass. In one embodiment of the solar cell according to the invention, the solar cell at least comprises as solar cell parts:

i) a wafer with at least one hole with a Si surface;
ii) an electrode comprised by a hole, wherein the concentration of glass in the electrode is higher at the surface at which the electrode contacts the Si surface than in the main body of the electrode.

Additional Protective Layers

In addition to the layers described above which directly contribute to the principle function of the solar cell, further layers can be added for mechanical and chemical protection.

The cell can be encapsulated to provide chemical protection. Encapsulations are well known to the person skilled in the art and any encapsulation can be employed which is known to him and which he considers suitable in the context of the invention. According to the invention, transparent polymers, often referred to as transparent thermoplastic resins, are preferred as the encapsulation material, if such an encapsulation is present. Preferred transparent polymers in this context are for example silicon rubber and polyethylene vinyl acetate (PVA).

A transparent glass sheet can be added to the front of the solar cell to provide mechanical protection to the front face of the cell. Transparent glass sheets are well known to the person skilled in the art and any transparent glass sheet known to him and which he considers to be suitable in the context of the invention can be employed as protection on the front face of the solar cell.

A back protecting material can be added to the back face of the solar cell to provide mechanical protection. Back protecting materials are well known to the person skilled in the art and any back protecting material which is known to the person skilled in the art and which he considers to be suitable in the context of the invention can be employed as protection on the back face of the solar cell. Preferred back protecting materials according to the invention are those having good mechanical properties and weather resistance. The preferred back protection materials according to the invention is polyethylene terephthalate with a layer of polyvinyl fluoride. It is preferred according to the invention for the back protecting material to be present underneath the encapsulation layer (in the event that both a back protection layer and encapsulation are present).

A frame material can be added to the outside of the solar cell to give mechanical support. Frame materials are well known to the person skilled in the art and any frame material known to the person skilled in the art and which he considers suitable in the context of the invention can be employed as frame material. The preferred frame material according to the invention is aluminium.

Solar Panels

A contribution to achieving at least one of the above mentioned objects is made by a module comprising at least a solar cell obtained as described above, in particular according to at least one of the above described embodiments, and at least one more solar cell. A multiplicity of solar cells according to the invention can be arranged spatially and electrically connected to form a collective arrangement called a module. Preferred modules according to the invention can take a number of forms, preferably a rectangular surface known as a solar panel. A large variety of ways to electrically connect solar cells as well as a large variety of ways to mechanically arrange and fix such cells to form collective arrangements are well known to the person skilled in the art and any such methods known to him and which he considers suitable in the context of the invention can be employed. Preferred methods according to the invention are those which result in a low mass to power output ratio, low volume to power output ration, and high durability. Aluminium is the preferred material for mechanical fixing of solar cells according to the invention.

DESCRIPTION OF THE DRAWINGS

The invention is now explained by means of figures which are intended for illustration only and are not to be considered as limiting the scope of the invention. In brief, FIG. 1 shows a cross sectional view of a common layer configuration for a solar cell, FIG. 2 shows a cross sectional view of another common layer configuration for a solar cell, FIGS. 3a, 3b and 3c together illustrate the process of firing a front side paste.

FIGS. 4a, 4b, 4c, 4d and 4e together illustrate a process for preparing a wafer with a hole, a front doped layer and optional additional front layers, wherein the front doped layer and the optional additional front layers cover the surface of the hole.

FIGS. 5a, 5b, 5c, 5d and 5e together illustrate a process for preparing a wafer with a hole, a front doped layer and optional additional front layers, wherein the front doped layer and the optional additional front layers do not cover the surface of the hole.

FIG. 6 shows a layer of glass at the surface between the plug electrode and the wafer in a solar cell according to the invention.

FIG. 1 shows a cross sectional view of a common layer configuration for a solar cell 100 according to the invention (excluding additional layers which serve purely for chemical and mechanical protection). Starting from the back face and continuing towards the front face the solar cell 100 comprises a back electrode 107, a back passivation layer 112, a highly doped back layer 111, a back doped layer 104, a p-n junction boundary 102, a front doped layer 103, a front passivation layer 110, an anti-reflection layer 109, and front electrode 106, wherein the front electrode penetrates through the anti-reflection layer 109 and the front passivation layer 110 and into the front doped layer 103 far enough to form a good electrical contact with the front doped layer, but not so far as to shunt the p-n junction boundary 102. A hole electrode 105 is present in a hole joining the front and back faces of the solar cell. This electrode is preferably an Ag electrode according to the invention. In the case that 100 represents an n-type cell, the back electrode 107 is preferably a silver electrode, the highly doped back layer 111 is preferably Si heavily doped with P, the back doped layer 104 is preferably Si lightly doped with P, the front doped layer 103 is preferably Si heavily doped with B, the anti-reflection layer 109 is preferably a layer of silicon nitride and the front electrode 106 is preferably a mixture of silver and aluminium. In the case that 100 represents a p-type cell, the back electrode 107 is preferably a mixed silver and aluminium electrode, the highly doped back layer 111 is preferably Si heavily doped with B, the back doped layer 104 is preferably Si lightly doped with B, the front doped layer 103 is preferably Si heavily doped with P, the anti-reflection layer 109 is preferably a layer of silicon nitride and the front electrode 106 is preferably silver. FIG. 2 is schematic and shows only one hole. The invention does not limit the number of back electrodes 107, front electrodes 106, holes, or hole electrodes 105.

FIG. 2 shows a cross sectional view of a solar cell 200 and represents the minimum required layer configuration for a solar cell according to the invention. Starting from the back face and continuing towards the front face the solar cell 200 comprises a back electrode 107, a back doped layer 104, a p-n junction boundary 102, a front doped layer 103 and a front electrode 106, wherein the front electrode penetrates into the front doped layer 103 enough to form a good electrical contact with it, but not so much as to shunt the p-n junction boundary 102. The back doped layer 104 and the front doped layer 103 together constitute a single doped Si wafer 101. A hole electrode 105 is present in a hole joining the front and back faces of the solar cell.

Figure 3A:
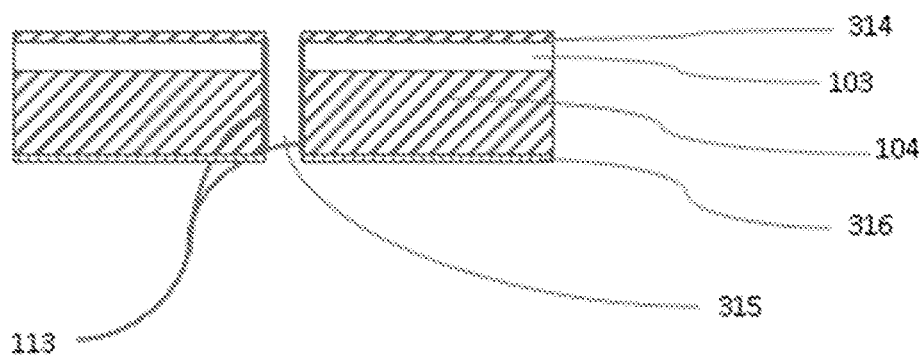

This electrode is preferably an Ag electrode according to the invention. In the case that 200 represents an n-type cell, the back electrode 107 is preferably a silver electrode, the back doped layer 104 is preferably Si lightly doped with P, the front doped layer 103 is preferably Si heavily doped with B and the front electrode 106 is preferably a mixed silver and aluminium electrode. In the case that 200 represents a p-type cell, the back electrode 107 is preferably a mixed silver and aluminium electrode, the back doped layer 104 is preferably Si lightly doped with B, the front doped layer 103 is preferably Si heavily doped with P and the front electrode 106 is preferably a silver electrode. This diagram is schematic and the invention does not limit the number of front electrodes 105, back electrodes 107, holes or hole electrodes 105.

Figure 3B:
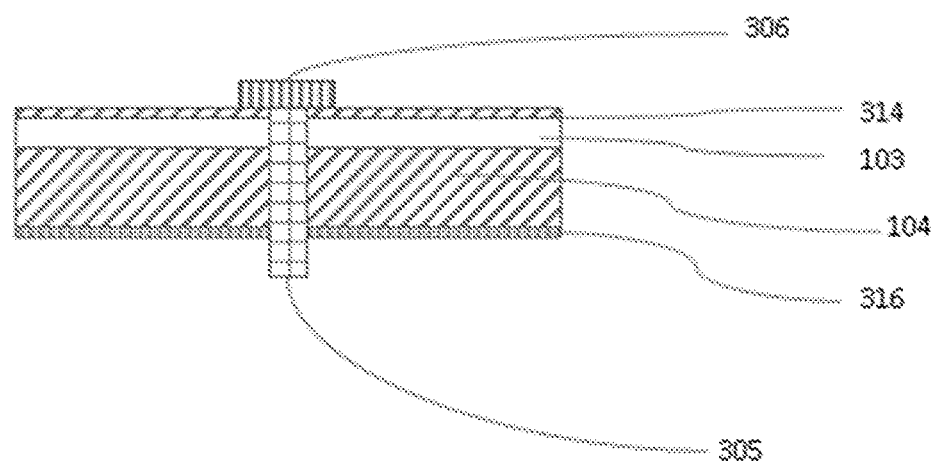

FIGS. 3a, 3b and 3c together illustrate the process of firing a precursor without front layers covering the surface of the hole to obtain a solar cell. FIGS. 3a, 3b and 3c are schematic and generalised and additional layers further to those constituting the p-n junction are considered simply as optional additional layers without more detailed consideration.

FIG. 3a illustrates a wafer before application of front electrode and hole electrode, 300a. Starting from the back face and continuing towards the front face the wafer before application of front electrode 300a optionally comprises additional layers on the back face 316, a back doped layer 104, a p-n junction boundary 102, a front doped layer 103 and additional layers on the front face 314. The additional layers on the back face 316 can comprise any of a back electrode, a back passivation layer, a highly doped back layer or none of the above. The additional layer on the front face 314 can comprise any of a front passivation layer, an anti-reflection layer or none of the above.

FIG. 3b shows a wafer with electro-conductive pastes applied to the front face and to a hole before firing 300b. In addition to the layers present in 300a described above, an electroconductive paste 306 is present on the surface of the front face and an electro-conductive paste 305 is present in the hole.

FIG. 3c shows a wafer with front electrode applied 300c. In addition to the layers present in 300a described above, a front side electrode 106 is present which penetrates from the surface of the front face through the additional front layers 314 and into the front doped layer 103 and is formed from the electro-conductive paste 306 of FIG. 3b by firing. A hole electrode 105, which has been formed from the electro-conductive paste 305 of FIG. 3b by firing, is present in the hole.

In FIGS. 3b and 3c, only one hole, one front electrode and one hole electrode are shown. This diagram is schematic and the invention does not limit the number of holes, front electrodes or hole electrodes.

FIGS. 4a, 4b, 4c, 4d and 4e together illustrate a process for preparing a wafer with a hole, a front doped layer and optional additional front layers, wherein the front doped layer and the optional additional front layers cover the surface of the hole.

FIG. 4a shows a wafer which will later constitute the back doped layer 104.

FIG. 4b shows a wafer 104 after a hole 315 has been made.

FIG. 4c shows a wafer 104 with a hole 315 after what will later constitute the front doped layer 103 has been applied. This layer 103 is present on each side of the wafer and on the surface of the hole.

FIG. 4d shows the wafer 104 with a hole 315 and front doped layer 103 after additional front layers 314 have been applied. This layer 314 is present on each side of the wafer and on the surface of the hole.

FIG. 4e shows the wafer 104 with a hole 315, front doped layer 103 and additional front layers 314 after cutting back and sides so as to leave the front doped layer 103 and additional front layers 314 present on the front face and surface of hole only.

FIGS. 5a, 5b, 5c, 5d and 5e together illustrate a process for preparing a wafer with a hole, a front doped layer and optional additional front layers, wherein the front doped layer and the optional additional front layers do not cover the surface of the hole.

FIG. 5a shows a wafer which will later constitute the back doped layer 104.

FIG. 5b shows a wafer 104 after what will later constitute the front doped layer 103 has been applied. This layer 103 is present on each side of the wafer.

FIG. 5c shows the wafer 104 with front doped layer 103 after additional front layers 314 have been applied. This layer 314 is present on each side of the wafer and on the surface of the hole.

FIG. 5d shows the wafer 104 with front doped layer 103 and additional front layers 314 after a hole 315 has been made. The front doped layer 103 and additional front layers 314 are present on all sides of the wafer but not on the surface of the hole.

FIG. 5e shows the wafer 104 with front doped layer 103, additional front layers 314 and hole 315 after cutting back and sides so as to leave the front doped layer 103 and additional front layers 314 present on the front face only.

FIG. 6 shows a scanning electron microscope image of the surface of a slice through a solar cell according to the invention. FIG. 6 shows both the wafer 601 and the plug electrode 602, along with a glass layer 603 at the surface where they meet.

Test Methods

The following test methods are used in the invention. In absence of a test method, the ISO test method for the feature to be measured being closest to the earliest filing date of the present application applies. In absence of distinct measuring conditions, standard ambient temperature and pressure (SATP) as a temperature of 298.15 K (25° C., 77° F.) and an absolute pressure of 100 kPa (14.504 psi, 0.986 atm) apply.

Specific Surface Area

BET measurements to determine the specific surface area of silver particles are made in accordance with DIN ISO 9277:1995. A Gemini 2360 (from Micromeritics) which works according to the SMART method (Sorption Method with Adaptive dosing Rate), is used for the measurement. As reference material Alpha Aluminum oxide CRM BAM-PM-102 available from BAM (Bundesanstalt für Materialforschung und-prüfung) is used. Filler rods are added to the reference and sample cuvettes in order to reduce the dead volume. The cuvettes are mounted on the BET apparatus.

The saturation vapor pressure of nitrogen gas ($N_2$ 5.0) is determined. A sample is weighed into a glass cuvette in such an amount that the cuvette with the filler rods is completely filled and a minimum of dead volume is created. The sample is kept at 80° C. for 2 hours in order to dry it. After cooling the weight of the sample is recorded. The glass cuvette containing the sample is mounted on the measuring apparatus. To degas the sample, it is evacuated at a pumping speed selected so that no material is sucked into the pump. The mass of the sample after degassing is used for the calculation. The dead volume is determined using Helium gas (He 4.6). The glass cuvettes are cooled to 77 K using a liquid nitrogen bath. For the adsorptive, $N_2$ 5.0 with a molecular cross-sectional area of 0.162 $nm^2$ at 77 K is used for the calculation. A multi-point analysis with 5 measuring points is performed and the resulting specific surface area given in $m^2/g$.

Glass Transition Temperature

The glass transition temperature Tg for glasses is determined using a DSC apparatus Netzsch STA 449 F3 Jupiter (Netzsch) equipped with a sample holder HTP 40000A69.010, thermocouple Type S and a platinum oven Pt S TC:S (all from Netzsch). For the measurements and data evaluation the measurement software Netzsch Messung V5.2.1 and Proteus Thermal Analysis V5.2.1 are applied. As pan for reference and sample, aluminium oxide pan GB 399972 and cap GB 399973 (both from Netzsch) with a diameter of 6.8 mm and a volume of about 85 µl are used. An amount of about 20 to about 30 mg of the sample is weighted into the sample pan with an accuracy of 0.01 mg. The empty reference pan and the sample pan are placed in the apparatus, the oven is closed and the measurement started. A heating rate of 10 K/min is employed from a starting temperature of 25° C. to an end temperature of 1000° C. The balance in the instrument is always purged with nitrogen ($N_2$ 5.0) and the oven is purged with synthetic air (80% $N_2$ and 20% $O_2$ from Linde) with a flow rate of 50 ml/min. The first step in the DSC signal is evaluated as glass transition using the software described above and the determined onset value is taken as the temperature for Tg.

$I_{rev}$

Device(s): screen printer (Eckra), IV-tester (halm). The wafer to be tested is characterized using a commercial IV-tester "cetisPV-CTL1" by Halm Elektronik GmbH. All parts of the measurement equipment as well as the solar cell to be tested are maintained at 25° C. during electrical measurement. This temperature is always measured simultaneously on the cell surface during the actual measurement by a temperature probe. The Xe Arc lamp simulates the sunlight with a known AM1.5 intensity of 1000 $W/m^2$ on the cell surface. To bring the simulator to this intensity, the lamp is flashed several times within a short period of time until it reaches a stable level monitored by the "PVCTControl 4.313.0" software of the IV-tester. The Halm IV tester uses a multi-point contact method to measure current (I) and voltage (V) to determine the cell's $I_{rev}$. To do so, the solar cell is placed between the multi-point contact probes in such a way that the probe fingers are in contact with the bus bars of the cell. The number of contact probe lines is adjusted to the number of bus bars on the cell surface. All electrical values are determined directly from this experiment automatically by the implemented software package. As a reference standard a calibrated solar cell from ISE Freiburg with the same area dimensions, same wafer material and processed using the same front side layout is tested and the data compared to the certificated values. At least 5 wafers processed in the very same way are measured and the average value calculated. The software PVCTControl 4.313.0 provides $I_{rev}$ values.

Viscosity

Viscosity measurements were performed using the Thermo Fischer Scientific Corp. "Haake Rheostress 600" equipped with a ground plate MPC60 Ti and a cone plate C 20/0.5° Ti and software "Haake RheoWin Job Manager 4.30.0". After setting the distance zero point, a paste sample sufficient for the measurement was placed on the ground plate. The cone was moved into the measurement positions with a gap distance of 0.026 mm and excess material was removed using a spatula. The sample was equilibrated to 25° C. for three minutes and the rotational measurement started. The shear rate was increased from 0 to 20 $s^{-1}$ within 48 s and 50 equidistant measuring points and further increased to 150 $s^{-1}$ within 312 s and 156 equidistant measuring points. After a waiting time of 60 s at a shear rate of 150 $s^{-1}$, the shear rate was reduced from 150 $s^{-1}$ to 20 $s^{-1}$ within 312 s and 156 equidistant measuring points and further reduced to 0 within 48 s and 50 equidistant measuring points. The micro torque correction, micro stress control and mass inertia correction were activated. The viscosity is given as the measured value at a shear rate of 100 $s^{-1}$ of the downward shear ramp.

Sheet Resistance

For measuring the sheet resistance of a doped silicon wafer surface, the device "GP4-Test Pro" equipped with software package "GP-4 Test 1.6.6 Pro" from the company GP solar GmbH is used. For the measurement, the 4 point measuring principle is applied. The two outer probes apply a constant current and two inner probes measure the voltage. The sheet resistance is deduced using the Ohmic law in)/square. To determine the average sheet resistance, the measurement is performed on 25 equally distributed spots of the wafer. In an air conditioned room with a temperature of 22±1° C., all equipment and materials are equilibrated before the measurement. To perform the measurement, the "GP-Test.Pro" is equipped with a 4-point measuring head (part no. 04.01.0018) with sharp tips in order to penetrate the anti-reflection and/or passivation layers. A current of 10 mA is applied. The measuring head is brought into contact with the non metalized wafer material and the measurement is started. After measuring 25 equally distributed spots on the wafer, the average sheet resistance is calculated in Ω/square.

Particles Size Determination ($d_{10}$, $d_{50}$, $d_{90}$)

Particle size determination for particles is performed in accordance with ISO 13317-3:2001. A Sedigraph 5100 with software Win 5100 V2.03.01 (from Micromeritics) which works according to X-ray gravitational technique is used for the measurement. A sample of about 400 to 600 mg is weighed into a 50 ml glass beaker and 40 ml of Sedisperse P11 (from Micromeritics, with a density of about 0.74 to 0.76 $g/cm^3$ and a viscosity of about 1.25 to 1.9 mPa·s) are added as suspending liquid. A magnetic stirring bar is added to the suspension. The sample is to dispersed using an ultrasonic probe Sonifer 250 (from Branson) operated at power level 2 for 8 minutes while the suspension is stirred with the stirring bar at the same time. This pre-treated sample is placed in the instrument and the measurement started. The temperature of the suspension is recorded (typical range 24° C. to 45° C.) and for calculation data of measured viscosity for the dispersing solution at this temperature are used. Using density and weight of the sample (10.5 $g/cm^3$ for silver) the particle size distribution is determined and given as $d_{50}$, $d_{10}$ and $d_{90}$.

Dopant Level

Dopant levels are measured using secondary ion mass spectroscopy.

Adhesion

The solar cell sample to be tested is secured in a commercially available soldering table M300-0000-0901 from Somont GmbH, Germany. A solder ribbon from Bruker Spalek (ECu+62Sn36Pb-2Ag) is coated with flux Kester 952S (from Kester) and adhered to the finger line or bus bar to be tested by applying the force of 12 heated pins which press the solder ribbon on the finger line or bus bar. The heated pins have a set temperature of 280° C. and the soldering preheat plate on which the sample is placed is set to a temperature of 175° C. After cooling to room temperature the samples are mounted on a GP Stable-Test Pro tester (GP Solar GmbH, Germany). The ribbon is fixed at the testing head and pulled with a speed of 100 mm/s and in a way that the ribbon part fixed to the cell surface and the ribbon part which is pulled enclose an angle of 45°. The force required to remove the bus bar/finger is measured in Newton. This process is repeated for contact at 10 equally spaced points along the finger/bus bar, including on measurement at each end. The mean is taken of the 10 results.

Scanning Electron Microscopy

The solar cell is cut in a way that the area of interest is laid open. The cut sample is placed in a container filled with embedding material and oriented such that the area of interest is on top. As embedding material, EpoFix (Struers) is used, mixed according to the instructions. After 8 hours curing at room temperature the sample can be processed further. In a first step the sample is ground with a Labopol-25 (Struers) using silicon carbide paper 180-800 (Struers) at 250 rpm. In further steps the sample is polished using a Rotopol-2 equipped with a Retroforce-4, MD Piano 220 and MD allegro cloth and DP-Spray P 3 um diamond spray (all from Struers). Coating with a carbon layer is performed with a Med 010 (Balzers) at a pressure of 2 mbar using a carbon thread 0.27 g/m E419ECO (from Plano GmbH). The examination was performed with a Zeiss Ultra 55 (Zeiss), equipped with a field emission electrode, an accelerating voltage of 20 kV and at a pressure of about $3*10^{-6}$ mbar.

Determination of Elemental Composition

In the area of the hole the finger electrodes (if present) are removed by sanding the fired wafer. Then the plug electrodes in the holes are punched out and collected. A known amount of the plug electrode material is then subjected to dissolution using nitro-hydrochloric acid and or hydrofluoric acid. The resulting solutions are then analysed using standard methods e.g. ICPOES (inductively coupled plasma optical emission spectrometry) or without a dissolution step by using micro X-ray fluorescence spectroscopy or EDX (energy dispersive X-ray spectroscopy) in an electron microscope.

EXAMPLES

The invention is now explained by means of examples which are intended for illustration only and are not to be considered as limiting the scope of the invention.

Example 1—Paste Preparation

A paste was made by mixing organic vehicle (Table 1), Ag powder (Silver-powder, 5-8 μm from Sigma-Aldrich with a particle size of 5-8 μm; product number: 327093), glass frit ground to $d_{50}$ of 2 μm, red phosphorus (Sigma-Aldrich, article number: 04004), $V_2O_5$ (Sigma-Aldrich, article number: 221899), $SiO_2$ (Sigma-Aldrich, article number: 83340, particle size $d_{90}$ 30 μm), $Sb_2O_3$ (Sigma-Aldrich, article number: 255998) and an additive according to the specific example. The paste was passed through a 3-roll mill at progressively increasing pressures from 0 to 8 bar. The viscosity was measured as mentioned above and appropriate amounts of organic vehicle with the composition given in Table 1 were added to adjust the paste viscosity toward a target in a range from about 20 to about 35 Pas. The wt. % s of the constituents of the paste are given in Table 2.

TABLE 1

| Organic Vehicle Component | Wt. % based on total weight of Organic Vehicle |
| --- | --- |
| 2-(2-butoxyethoxy)ethanol) [solvent] | 84.5 |
| ethyl cellulose (DOW Ethocel 4) [binder] | 6.5 |
| Thixcin ® E [thixotropic agent] | 9 |

TABLE 2

| Example # | Wt. % of $SiO_2$ | Wt. % of red phosphorus | Wt. % of $V_2O_5$ | Wt. % of $Sb_2O_3$ | Wt. % of Ag powder | Wt. % of Glass Frit | Wt. % of Organic Vehicle |
| --- | --- | --- | --- | --- | --- | --- | --- |
| 1 | 10 | 0 | 0 | 0 | 80 | 1 | 9 |
| 2 | 8 | 2 | 0 | 0 | 80 | 1 | 9 |
| 3 | 2 | 0 | 8 | 0 | 80 | 1 | 9 |
| 4 | 5 | 1 | 4 | 0 | 80 | 1 | 9 |
| Comparative | 0 | 0 | 0 | 10 | 80 | 1 | 9 |

Example 2—Measurement of $I_{rev}$ and Adhesion

Pastes were applied to full-square mono-crystalline p-type wafers without an n-type emitter layer and without any passivation or anti-reflective layer. The wafer dimensions were 156 mm×156 mm, the front side had a textured surface applied by an alkaline etching process. The example paste was screen-printed onto the front side of the wafer as a set of parallel finger lines. Printing was carried out using a ASYS Automatisierungssysteme GmbH Ekra E2 screen printer and a standard H-pattern screen from Koenen GmbH. The screen had 75 finger lines with 110 μm openings and two 1.5 mm wide bus bars. The Emulsion over mesh was in a range from about 16 to about 20 μm, the screen had 325 mesh and 20 μm stainless steel wire. The printing parameters were 1.2 bar squeegee pressure, forward squeegee speed 150 mm/s and flooding speed 200 mm/s and a snap off of 1.5 mm. The device with the printed pattern was then dried in an oven for 10 minutes at 150° C. The substrates were then fired sun-side up with a Centrotherm Cell & Module GmbH "c-fire" fast firing furnace. The furnace consists of 6 zones.

Zone 1 was set to 350° C., zone 2 to 475° C., zone 3 to 470° C., zone 4 to 540° C., zone 5 to 840° C. and zone 6 to 880° C. The belt speed was set to 5100 min/min. The fully processed samples were then tested for adhesion of the bus bars formed from the example paste, a high value being considered as favourable. $I_{rev}$ was evaluated at −12 V, a low value being considered as favourable. For each paste, the results for $I_{rev}$ and adhesion are shown in Table 3.

TABLE 3

| Example # | Wt. % SiO$_2$ | Wt. % of P | Wt. % V$_2$O$_5$ | $I_{rev}$ | Adhesion |
|---|---|---|---|---|---|
| 1 | 10 | 0 | 0 | + | − |
| 2 | 8 | 2 | 0 | ++ | + |
| 3 | 2 | 0 | 8 | + | ++ |
| 4 | 5 | 1 | 4 | ++ | ++ |
| Comparative | 0 | 0 | 0 | −− | − |

Results expressed on a scale:
−− very unfavourable,
− unfavourable,
o medium,
+ favourable,
++ very favourable Example 3—Solar Cell Preparation Pastes were applied to full-square mono-crystalline p-type wafers with a lightly doped n-type emitter (LDE) with a sheet resistance of 90 SI/square. The wafer dimensions were 156 mm×156 mm, the front side had a textured surface applied by an alkaline etching process. The front side was also coated with a 70 nm thick PECVD (plasma enhanced chemical vapour deposition) SiNx passivation and anti-reflective layer, commercially available from Fraunhofer ISE. Channels of 150 μm diameter joining the front face and the back face of the wafer were drilled using a laser drill in a square grid pattern on the wafer spaced 3.85 cm apart. The example paste was screen-printed into the channels and as a first set of dots on the back side of the wafer with a diameter of 2 mm in contact with the channels and as a second set of dots on the back side of the wafer with a diameter of 5 mm not in contact with the channels. A standard commercial silver paste (SOL9411 from Heraeus Precious Metals GmbH & Co. KG) was printed onto the front face of the wafer as a set of parallel finger lines with 80 μm openings and four 1.5 mm wide bus bars contacting the holes using a standard H-pattern screen from Koenen GmbH. A commercially available Al paste, "Gigasolar 108" from Giga Solar Materials Corp., was printed on the back face of the device in contact with the second set of dots, but not in contact with the first set of dots. The Emulsion over mesh was in a range from about 16 to about 20 μm, the screen had 325 mesh and 20 μm stainless steel wire. The printing parameters were 1.2 bar squeegee pressure, forward squeegee speed 150 mm/s and flooding speed 200 mm/s and a snap off of 1.5 mm. The device with the printed patterns on both sides was then dried in an oven for 10 minutes at 150° C. The substrates were then fired sun-side up with a Centrotherm Cell & Module GmbH "c-fire" fast firing furnace. The furnace consists of 6 zones. Zone 1 was set to 350° C., zone 2 to 475° C., zone 3 to 470° C., zone 4 to 540° C., zone 5 to 840° C. and zone 6 to 880° C. The belt speed was set to 5100 mm/min. The thus produced solar cell exhibited particularly favourable Irev performance with a high overall mechanical stability. As can be seen from FIG. 6, a scanning electron microscope image of the cut containing the wafer/plug electrode surface, a homogeneous and completely covering layer of glass has been formed between the wafer and the plug electrode in this example according to the invention.

REFERENCE LIST

100 Solar cell
101 Doped Si wafer
102 p-n junction boundary
103 Front doped layer
104 Back doped layer
105 Electrode in channel (plug electrode)
106 Front electrode
107 Back electrode
109 Anti-reflection layer
110 Front passivation layer
111 Highly doped back layer
112 Back passivation layer
113 Surface of hole
200 Solar cell
300a Solar cell precursor
300b Solar cell precursor
300c Solar cell precursor
305 Plug paste
306 Front paste
314 Additional layers on front face
315 Hole
316 Additional back layers
401 Wafer
600 Wafer/plug electrode boundary with glass layer
601 Wafer
602 Plug electrode
603 Glass layer

The invention claimed is:

1. A solar cell precursor at least comprising as precursor parts:
    i) a wafer with at least one hole, the wafer having Si on the surface of the hole;
    ii) an electro-conductive paste at least comprising as paste constituents:
        a) metallic particles;
        b) an inorganic reaction system;
        c) an organic vehicle;
        d) SiO$_2$ particles having no glass transition temperature below about 750° C., or a glass transition temperature which is at least about 50° C. higher than the glass transition temperature of the inorganic reaction system; and
        e) an additive;
    the paste being present in the at least one hole.

2. The solar cell precursor according to claim 1, wherein the SiO$_2$ particles are present in a range from about 0.1 to about 22 wt. %, based on the total weight of the paste.

3. The solar cell precursor according to claim 1, wherein the inorganic reaction system is present in the paste in a range from about 0.1 to about 5 wt. %.

4. The solar cell precursor according to claim 1, wherein the inorganic reaction system is a glass frit.

5. The solar cell precursor according to claim 1, wherein the wafer has a front face and a back face and the at least one hole in the wafer is a channel joining the front face and the back face of the wafer.

6. The solar cell precursor according to claim 1, wherein the metallic particles are Ag particles.

7. The solar cell precursor according to claim 1, wherein the paste is in direct contact with the Si surface of the hole.

8. The solar cell precursor according to claim 1, wherein a further electro-conductive paste is present on the front face of the wafer.

9. A process for the preparation of a solar cell comprising the steps:
   i) providing a solar cell precursor according to claim 1;
   ii) firing the solar cell precursor to obtain a solar cell.

10. The process for the preparation of a solar cell according to claim 9 wherein the providing according to step i) comprises the steps:
   a) providing a Si wafer with a back doped layer and a front doped layer of opposite doping types;
   b) making at least one hole in the wafer;
   c) introducing an electro-conductive paste into at least one hole to give the solar cell precursor.

11. A solar cell obtained by the process according to claim 9.

12. A solar cell according to claim 11 comprising as solar cell parts:
   i) a wafer with at least one hole with a Si surface;
   ii) an electrode comprised by a hole,
wherein the concentration of glass in the electrode is higher at the surface at which the electrode contacts the Si surface than in the main body of the electrode.

13. A module comprising at least one solar cell according to claim 11 and at least a further solar cell.

14. A solar cell precursor at least comprising as precursor parts:
   i) a wafer with at least one hole, the wafer having Si on the surface of the hole;
   ii) an electro-conductive paste at least comprising as paste constituents:
      a) metallic particles;
      b) an inorganic reaction system;
      c) an organic vehicle;
      d) inorganic oxide particles having no glass transition temperature below about 750° C., or a glass transition temperature which is at least about 50° C. higher than the glass transition temperature of the inorganic reaction system; and
      e) an additive;
the paste being present in the at least one hole;
wherein the paste further contains a vanadium containing compound.

15. The solar cell precursor according to claim 14, wherein the vanadium content of the vanadium containing compound in a range from about 0.1 to about 22 wt. %, based on the total weight of the paste.

16. The solar cell precursor according to claim 14, wherein the vanadium content of the vanadium containing compound and the content of elements other than oxygen in the inorganic oxide particles are in a range from about 7:1 to about 2:1.

17. The solar cell precursor according to claim 14, wherein the vanadium containing compound is $V_2O_5$.

18. The solar cell precursor according to claim 14, wherein the inorganic oxide particles are present in a range from about 0.1 to about 22 wt. %, based on the total weight of the paste.

19. The solar cell precursor according to claim 14, wherein the inorganic reaction system is present in the paste in a range from about 0.1 to about 5 wt. %.

20. The solar cell precursor according to claim 14, wherein the inorganic reaction system is a glass frit.

21. The solar cell precursor according to claim 14, wherein the metallic particles are Ag particles.

22. The solar cell precursor according to claim 14, wherein the paste is in direct contact with the Si surface of the hole.

23. The solar cell precursor according to claim 14, wherein a further electro-conductive paste is present on the front face of the wafer.

24. A process for the preparation of a solar cell at least comprising the steps:
   i) providing a solar cell precursor according to claim 14;
   ii) firing the solar cell precursor to obtain a solar cell.

25. The process for the preparation of a solar cell according to claim 24 wherein the providing according to step i) comprises the steps:
   a) providing a Si wafer with a back doped layer and a front doped layer of opposite doping types;
   b) making at least one hole in the wafer;
   c) introducing an electro-conductive paste into at least one hole to give the solar cell precursor.

26. A solar cell obtainable by the process according to claim 24.

27. A solar cell according to claim 26 comprising as solar cell parts:
   i) a wafer with at least one hole with a Si surface;
   ii) an electrode comprised by a hole,
wherein the concentration of glass in the electrode is higher at the surface at which the electrode contacts the Si surface than in the main body of the electrode.

28. A module comprising at least one solar cell according to claim 26 and at least a further solar cell.

29. A solar cell precursor at least comprising as precursor parts:
   i) a wafer with at least one hole, the wafer having Si on the surface of the hole;
   ii) an electro-conductive paste at least comprising as paste constituents:
      a) metallic particles;
      b) an inorganic reaction system;
      c) an organic vehicle;
      d) inorganic oxide particles having no glass transition temperature below about 750° C., or a glass transition temperature which is at least about 50° C. higher than the glass transition temperature of the inorganic reaction system; and
      e) an additive;
the paste being present in the at least one hole;
wherein the paste further contains a phosphorus containing material selected from the group consisting of elemental phosphorus, a phosphorus containing compound or both.

30. The solar cell precursor according to claim 29, wherein the phosphorus content of the phosphorus containing material is in a range from about 0.1 to about 22 wt. %, based on the total weight of the paste.

31. The solar cell precursor according to claim 29, wherein the phosphorus content of the phosphorus containing material and the content of elements other than oxygen of the inorganic oxide particles are in a weight ratio in a range from about 1:5 to about 2:1.

32. The solar cell precursor according to claim 29, wherein the phosphorus containing material is red phosphorus or phosphorus oxide.

33. The solar cell precursor according to claim 29, wherein the inorganic oxide particles are present in a range from about 0.1 to about 22 wt. %, based on the total weight of the paste.

34. The solar cell precursor according to claim 29, wherein the inorganic reaction system is present in the paste in a range from about 0.1 to about 5 wt. %.

35. The solar cell precursor according to claim 29, wherein the inorganic reaction system is a glass frit.

36. The solar cell precursor according to claim 29, wherein the metallic particles are Ag particles.

37. The solar cell precursor according to claim 29, wherein the paste is in direct contact with the Si surface of the hole.

38. The solar cell precursor according to claim 29, wherein a further electro-conductive paste is present on the front face of the wafer.

39. A process for the preparation of a solar cell at least comprising the steps:
i) providing a solar cell precursor according to claim 29;
ii) firing the solar cell precursor to obtain a solar cell.

40. The process for the preparation of a solar cell according to claim 39 wherein the providing according to step i) comprises the steps:
a) providing a Si wafer with a back doped layer and a front doped layer of opposite doping types;
b) making at least one hole in the wafer;
c) introducing an electro-conductive paste into at least one hole to give the solar cell precursor.

41. A solar cell obtainable by the process according to claim 39.

42. A solar cell according to claim 41 comprising as solar cell parts:
i) a wafer with at least one hole with a Si surface;
ii) an electrode comprised by a hole,
wherein the concentration of glass in the electrode is higher at the surface at which the electrode contacts the Si surface than in the main body of the electrode.

43. A module comprising at least one solar cell according to claim 41 and at least a further solar cell.

44. A solar cell precursor at least comprising as precursor parts:
i) a wafer with at least one hole, the wafer having Si on the surface of the hole;
ii) an electro-conductive paste at least comprising as paste constituents:
a) metallic particles;
b) an inorganic reaction system;
c) an organic vehicle;
d) inorganic oxide particles having no glass transition temperature below about 750° C., or a glass transition temperature which is at least about 50° C. higher than the glass transition temperature of the inorganic reaction system; and
e) an additive;
the paste being present in the at least one hole;
wherein the inorganic oxide particles have a $d_{90}$ of at least about 20 μm.

45. The solar cell precursor according to claim 44, wherein the inorganic oxide particles are present in a range from about 0.1 to about 22 wt. %, based on the total weight of the paste.

46. The solar cell precursor according to claim 44, wherein the inorganic reaction system is present in the paste in a range from about 0.1 to about 5 wt. %.

47. The solar cell precursor according to claim 44, wherein the inorganic reaction system is a glass frit.

48. The solar cell precursor according to claim 44, wherein the metallic particles are Ag particles.

49. The solar cell precursor according to claim 44, wherein the paste is in direct contact with the Si surface of the hole.

50. The solar cell precursor according to claim 44, wherein a further electro-conductive paste is present on the front face of the wafer.

51. A process for the preparation of a solar cell comprising the steps:
i) providing a solar cell precursor according to claim 44;
ii) firing the solar cell precursor to obtain a solar cell.

52. The process for the preparation of a solar cell according to claim 51 wherein the providing according to step i) comprises the steps:
a) providing a Si wafer with a back doped layer and a front doped layer of opposite doping types;
b) making at least one hole in the wafer;
c) introducing an electro-conductive paste into at least one hole to give the solar cell precursor.

53. A solar cell obtainable by the process according to claim 51.

54. A solar cell according to claim 53 comprising as solar cell parts:
i) a wafer with at least one hole with a Si surface;
ii) an electrode comprised by a hole,
wherein the concentration of glass in the electrode is higher at the surface at which the electrode contacts the Si surface than in the main body of the electrode.

55. A module comprising at least one solar cell according to claim 53 and at least a further solar cell.

56. A solar cell precursor at least comprising as precursor parts:
i) a wafer with at least one hole, the wafer having Si on the surface of the hole;
ii) an electro-conductive paste at least comprising as paste constituents:
a) metallic particles;
b) an inorganic reaction system;
c) an organic vehicle;
d) inorganic oxide particles having no glass transition temperature below about 750° C., or a glass transition temperature which is at least about 50° C. higher than the glass transition temperature of the inorganic reaction system; and
e) an additive;
the paste being present in the at least one hole;
wherein the Si surface in at least one hole comprises at least a p-type doped section and an n-type doped section.

57. The solar cell precursor according to claim 56, wherein the inorganic oxide particles are present in a range from about 0.1 to about 22 wt. %, based on the total weight of the paste.

58. The solar cell precursor according to claim 56, wherein the inorganic reaction system is present in the paste in a range from about 0.1 to about 5 wt. %.

59. The solar cell precursor according to claim 56, wherein the inorganic reaction system is a glass frit.

60. The solar cell precursor according to claim 56, wherein the metallic particles are Ag particles.

61. The solar cell precursor according to claim 56, wherein the paste is in direct contact with the Si surface of the hole.

62. The solar cell precursor according to claim 56, wherein a further electro-conductive paste is present on the front face of the wafer.

63. A process for the preparation of a solar cell at least comprising the steps:
i) providing a solar cell precursor according to claim 56;
ii) firing the solar cell precursor to obtain a solar cell.

64. The process for the preparation of a solar cell according to claim 63 wherein the providing according to step i) comprises the steps:
- a) providing a Si wafer with a back doped layer and a front doped layer of opposite doping types;
- b) making at least one hole in the wafer;
- c) introducing an electro-conductive paste into at least one hole to give the solar cell precursor.

65. A solar cell obtainable by the process according to claim 63.

66. A solar cell according to claim 65 comprising as solar cell parts:
- i) a wafer with at least one hole with a Si surface;
- ii) an electrode comprised by a hole, wherein the concentration of glass in the electrode is higher at the surface at which the electrode contacts the Si surface than in the main body of the electrode.

67. A module comprising at least one solar cell according to claim 65 and at least a further solar cell.

* * * * *